(12) United States Patent
Onuki et al.

(10) Patent No.: US 7,573,659 B2
(45) Date of Patent: Aug. 11, 2009

(54) OPTICAL ELEMENT HOLDING APPARATUS AND EXPOSURE APPARATUS

(75) Inventors: Ichiro Onuki, Kawasaki (JP); Kenichi Kobayashi, Utsunomiya (JP); Kenji Yoshida, Utsunomiya (JP); Jun Ota, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 11/925,373

(22) Filed: Oct. 26, 2007

(65) Prior Publication Data
US 2008/0117534 A1 May 22, 2008

(30) Foreign Application Priority Data
Oct. 27, 2006 (JP) .............................. 2006-291938
Oct. 30, 2006 (JP) .............................. 2006-293429

(51) Int. Cl.
*G02B 7/02* (2006.01)
(52) U.S. Cl. ...................... 359/822; 359/823
(58) Field of Classification Search ................. 359/822, 359/823
See application file for complete search history.

(56) References Cited

U.S. PATENT DOCUMENTS 6,593,585 B1    7/2003   Loopstra et al.

2002/0163741 A1 *  11/2002  Shibazaki ................... 359/819
2005/0133732 A1 *   6/2005  Ohtomo et al. ........... 250/492.1

FOREIGN PATENT DOCUMENTS

JP      2003-337272    11/2003
KR      2001-0051996    6/2001

OTHER PUBLICATIONS

Korean Office Action, dated Jan. 28, 2009, concerning Korean patent application No. 10-2007-0108121, which is a foreign counterpart to instant application. (3 pages in Korean language are provided).

* cited by examiner

*Primary Examiner*—Jordan M. Schwartz
*Assistant Examiner*—James C Jones
(74) *Attorney, Agent, or Firm*—Rossi, Kimms & McDowell LLP

(57) ABSTRACT

A holding apparatus for holding an optical element includes a measuring part configured to measure a coordinate of the optical element, and a driving part configured to move the optical element based on the coordinate measured by the measuring part, wherein the measuring part includes a first sensor configured to detect a displacement amount of a part of the optical element, and a second sensor configured to detect that a part of the optical element is located at a predetermined position.

4 Claims, 29 Drawing Sheets

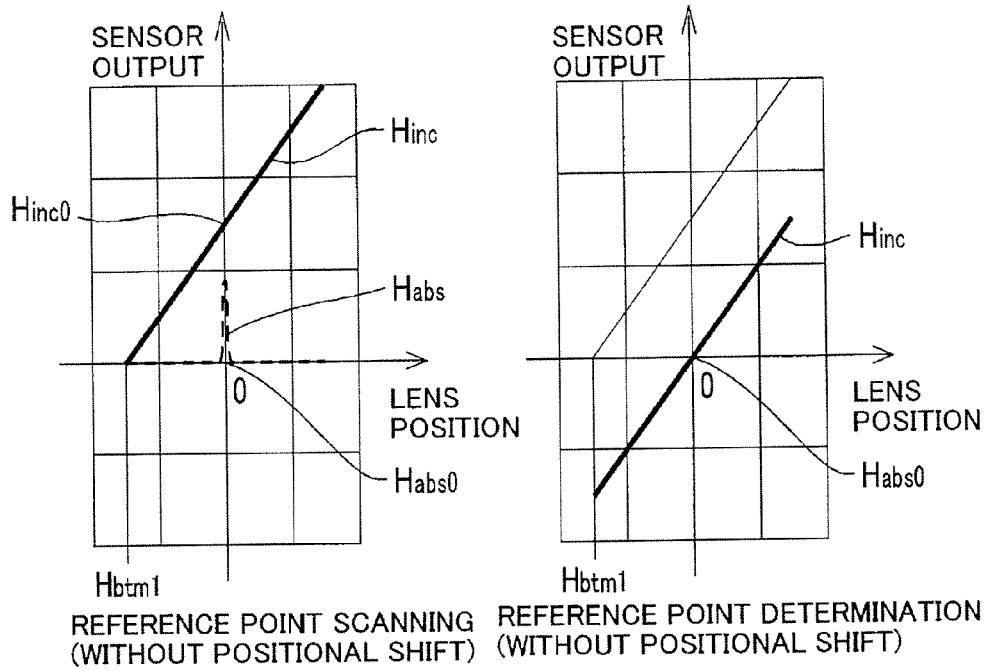
FIG. 27A — REFERENCE POINT SCANNING (WITHOUT POSITIONAL SHIFT)
FIG. 27B — REFERENCE POINT DETERMINATION (WITHOUT POSITIONAL SHIFT)
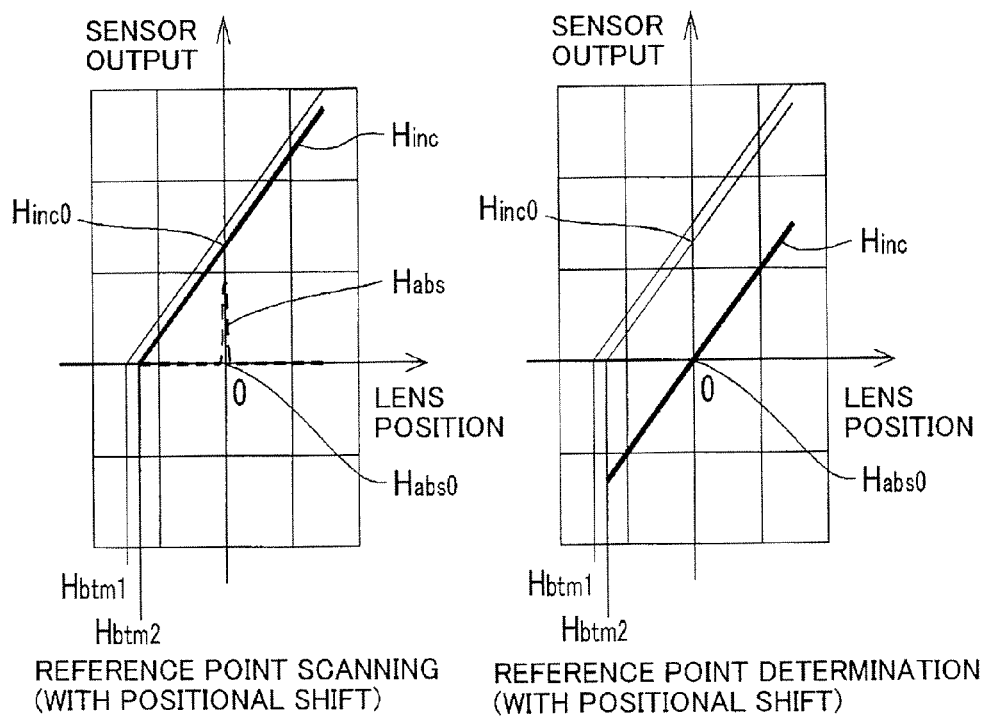
FIG. 27C — REFERENCE POINT SCANNING (WITH POSITIONAL SHIFT)
FIG. 27D — REFERENCE POINT DETERMINATION (WITH POSITIONAL SHIFT)

OPTICAL ELEMENT HOLDING APPARATUS AND EXPOSURE APPARATUS

BACKGROUND OF THE INVENTION

The present invention relates to a holding apparatus that holds an optical element, and an exposure apparatus.

For a position measuring part in an optical element holding unit that includes a driving part that drives an optical element, and a position measuring part that measures a position of the optical element, the conventional technology uses two types of position adjustment apparatuses (see, for example, Japanese Patent Laid-Open No. ("JP") 2003-337272).

A holding unit shown in FIG. 13 of JP 2003-337272 provides a position adjusting mechanism with two degrees of freedom which can drive an object in a center axis direction and a tangential direction, at three locations along the circumferential direction. An optical element has six driving degrees of freedom in a XYZ orthogonal coordinate system having a Z-axis as an optical axis of the optical element, and a XY plane perpendicular to the Z axis. The optical element is allowed to translate in each of the X-axis direction, Y-axis direction, and Z-axis direction, to tilt around each of the X axis and the Y axis, and rotate around the Z axis.

The holding unit has a position measuring part that measures a position of the optical element, and is provided at three locations along the circumferential direction. The position measuring part uses a biaxial electrical capacitance sensor that detects a displacement between an optical axis direction and outer-circumferential tangential direction of the optical element.

The holding unit shown in FIG. 2 of JP 2003-337273 includes a position adjusting mechanism that drives an optical element in the optical axis direction using a piezoelectric actuator and is provided at three locations along the circumferential direction, allowing the optical element to translate in the Z-axis direction and to tilt around each of the X axis and the Y axis.

The position measuring part of the optical element is provided at three locations around the circumferential direction. The position measuring part is an optical linear encoder that detects a displacement of the optical element in the optical axis direction.

The holding unit shown in FIG. 13 of JP 2003-337272 uses the electrical capacitance sensor for the position measuring part, and is inferior to an interference type displacement gage in detection resolution, dynamic range, and linearity of the detection output signal. The electrical capacitance sensor can detect an absolute position.

In addition, the holding unit shown in FIG. 2 of JP 2003-337272 uses an optical linear encoder that detects a displacement of an optical element in the optical axis direction, and thus can detect only a relative moving amount of a target, resulting in an incapable cognition of an absolute position of the optical element when holding unit is restarted after the power is shut down. Thus, the optical element cannot be reset to a coordinate value before the power is shut down.

The holding unit shown in FIG. 2 and that shown in FIG. 13 in JP 2003-337272 hold separate optical elements.

BRIEF SUMMARY OF THE INVENTION

The present invention is directed to an improvement of accuracy of positioning an optical element to a target position.

A holding apparatus for holding an optical element according to one aspect of the present invention includes a measuring part configured to measure a coordinate of the optical element, and a driving part configured to move the optical element based on the coordinate measured by the measuring part, wherein the measuring part includes a first sensor configured to detect a displacement amount of a part of the optical element, and a second sensor configured to detect that a part of the optical element is located at a predetermined position.

An exposure apparatus that includes the above holding unit constitutes another aspect of the present invention.

A further object and other characteristics of the present invention will be made clear by the preferred embodiments described below referring to accompanying drawings.

BRIEF DESCRIPTION OF THE DRAWINGS

FIG. 19A shows reference point scanning (with no positional offset) of the absolute-type perpendicular-displacement detecting sensor. FIG. 19B shows reference point scanning (with no positional offset) of the incremental-type perpendicular-displacement detecting sensor. FIG. 19C shows reference point scanning (with a positional offset) of the absolute-type perpendicular-displacement detecting sensor. FIG. 19D shows reference point scanning (with a positional offset) of the incremental-type perpendicular-displacement detecting sensor.

FIGS. 27A-D are explanatory views of reference point scanning and a reference point determination method of the perpendicular-displacement detecting sensor. FIG. 27A shows reference point scanning (with no positional offset) of the absolute-type perpendicular-displacement detecting sensor. FIG. 27B shows reference point scanning (with no positional offset) of the incremental-type perpendicular-displacement detecting sensor. FIG. 27C shows reference point scanning (with a positional offset) of the absolute-type perpendicular-displacement detecting sensor. FIG. 27D shows reference point scanning (with a positional offset) of the incremental-type perpendicular-displacement detecting sensor.

DESCRIPTION OF THE EMBODIMENTS

Figure 1:
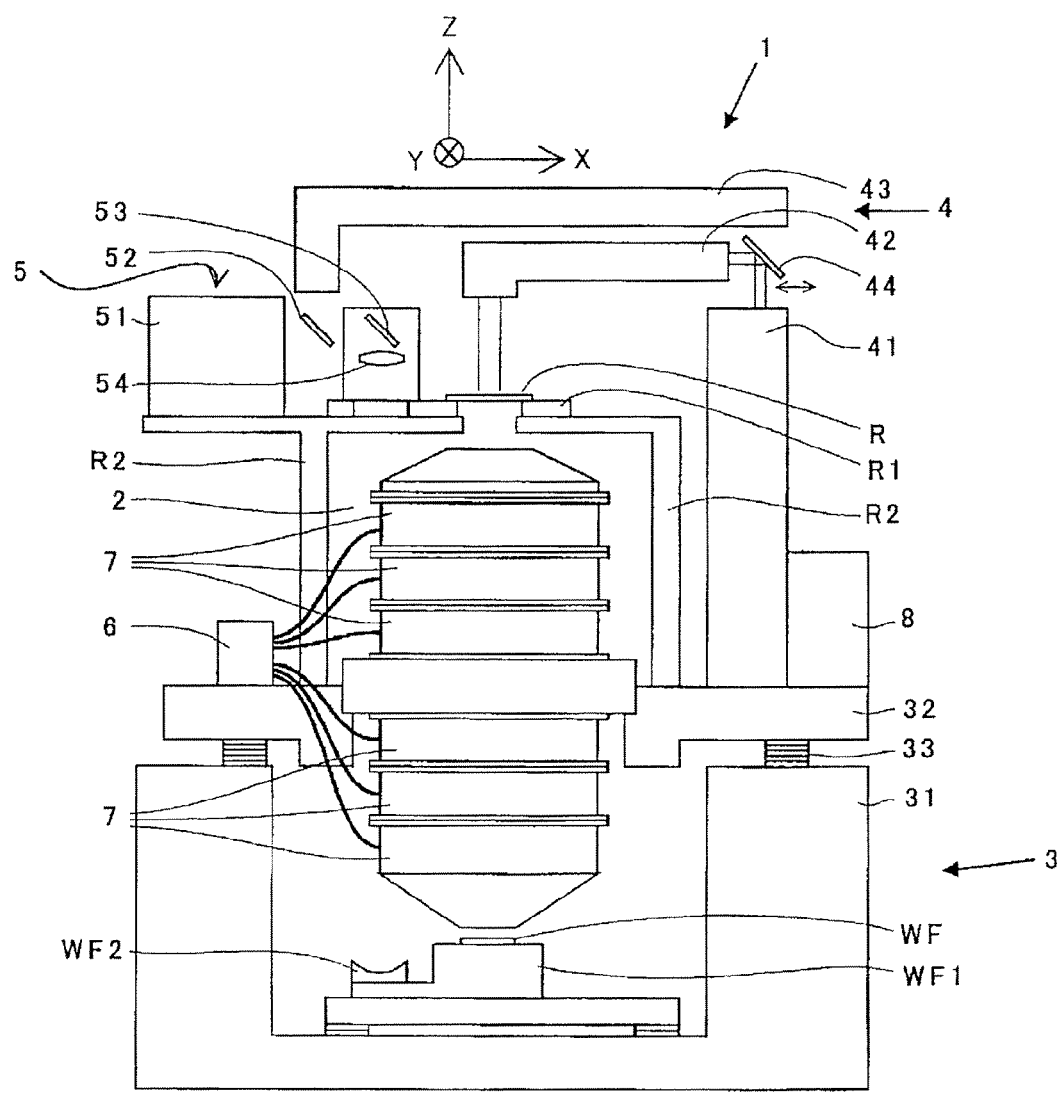
FIG. 1 is an explanatory view showing an exposure apparatus that includes an optical element holding unit according to a first embodiment of the present invention.

Referring now to the accompanying drawings, a description will be given of one aspect of the present invention. In each figure, the same reference numeral designates the same element, and a duplicate description thereof will be omitted.

First Embodiment

FIG. 1 shows an exposure apparatus that includes an optical element holding unit according to a first embodiment of the present invention. This exposure apparatus 1 is a scanning exposure apparatus that drives and scans a reticle R under a slit illumination, and synchronously drives and scans a wafer WF in an exposure action.

In this exposure apparatus, a XYZ orthogonal coordinate system is defined on an upper side in the figure, where the Z axis is an optical axis direction of the projection optical system 2 extending in the vertical direction of the apparatus, the X axis is a scan direction of the reticle R and the wafer WF, and the Y axis is the direction orthogonal to the X axis in the apparatus plane.

An exposure apparatus table 3 includes a bottomed, cylindrical body 31, a barrel mount 32 that houses and fixes part of the projection optical system 2 in the body 31. A damper 33 is provided between the body 31 and the barrel mount 32 to prevent transmissions of vibrations of the exposure apparatus installation plane to the projection optical system 2.

A wafer stage WF1 is provided on a bottom of the body 31 for focusing or so as to adjust a position of the wafer WF in the optical axis direction. The wafer stage WF1 moves the wafer WF in the X-axis direction in synchronization with scanning of the reticle stage R1. The wafer stage WF1 can adjust its position in the Y-axis direction so as to improve the overlay accuracy of the reticle image. The wafer stage WF1 is provided with a spherical mirror WF2 used to measure the optical aberration of the projection optical system 2. A photosensitive agent is applied to the wafer WF.

A reticle stage R1 mounted with the reticle R as an original for a semiconductor circuit pattern is placed on a reticle pedestal R2 that covers a top side of the projection optical system 2. The reticle pedestal R2 is used to fix the reticle stage R1 onto the barrel mount 32.

An illumination unit 4 stands on the barrel mount 32, and includes a laser light source unit 41, an exposure illuminator 42 used to illuminate the reticle R, an aberration calculation illuminator 43 used for the aberration measurement process, and an optical path switching mirror 44. A body controller 8 sits on the barrel mount 32 adjacent to the laser light source unit 41, and controls operations of the entire exposure apparatus.

An aberration measurement unit 5 sits on the reticle pedestal R2, and measures the optical aberration of the projection optical system 2. The aberration measurement unit 5 includes an interferometer 51, a half-mirror 52, a mirror 53, and a collimeter lens 54. The mirror 53 and the collimeter lens 54 are placed on the reticle stage R1, and configured to move back and forth above a luminous flux incident part of the projection optical system 2.

A lens controller 6 is provided on the barrel mount 32, and controls various optical elements in the projection optical system 2 in accordance with predetermined control flows. This control provides a fine adjustment to the optical system, such as an optimization of an optical aberration of a lens. The fine adjustment of the optical system is performed, for example, in the assembly of the projection optical system 2 and before shipping to a recipient of the exposure apparatus 1.

The projection optical system 2 includes plural lens units 7 each serving as an optical element holding unit. The lens unit 7 includes a driving part that drives the lens, and a position measuring part that measures a position of the lens.

Figure 2:
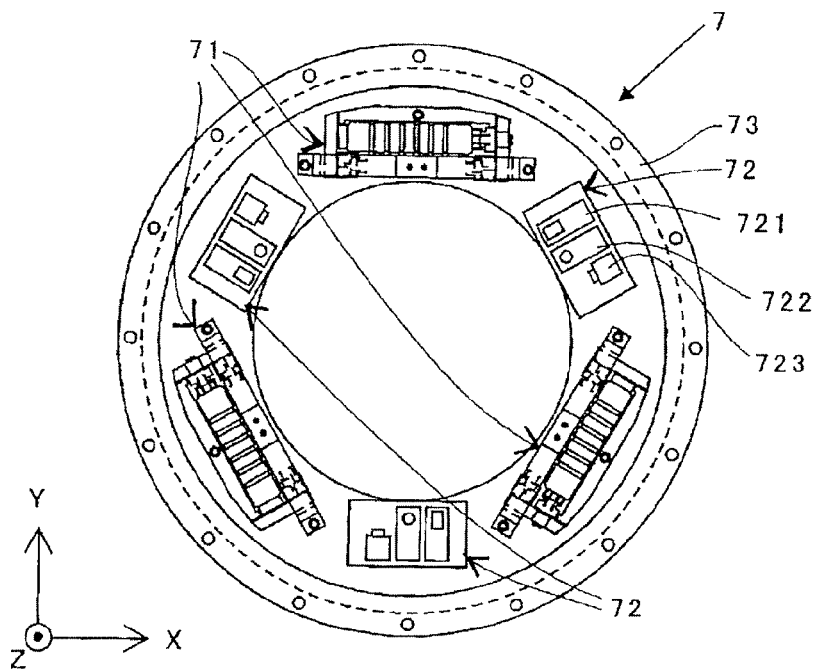
FIG. 2 is an explanatory view showing a detailed structure of a lens unit shown in FIG. 1.

FIG. 2 is a plane view of a structure of the lens unit 7. Three driving parts used to drive the lens are arranged as driving mechanisms 71 at 120° intervals on an annular fixture barrel 73 around the center axis. The position measuring parts used to measure a position of the lens are provided as lens-position detectors 72 among the driving mechanisms 71 along a circumferential direction. The lens-position detector 72 detects a displacement in the optical-axis or Z-axis direction of the lens frame 74, and a radial displacement orthogonal to the optical axis.

The lens-position detector 72 includes an absolute-type perpendicular-displacement detecting sensor 721 as a second measurement part, an incremental-type perpendicular-displacement detecting sensor 722 as a first measurement part, and an incremental-type lateral-displacement detecting sensor 723 as a third measurement part.

The absolute-type perpendicular-detecting sensor 721 is an apparatus that measures an absolute position of a lens as an optical element, and projects a detection laser beam to an optical-axis or Z-axis direction of the lens. The incremental-type perpendicular-displacement detecting sensor 722 is an apparatus that measures a relative position in an inclination direction to the optical axis (direction) of the lens, and projects a detection laser beam to the lens's optical axis direction (Z direction) similar to the absolute-type perpendicular-displacement detecting sensor 721. The incremental-type lateral-displacement detecting sensor 723 is an apparatus that measures the lens's relative position in a direction orthogonal to the optical axis direction, and projects the detection laser beam in the lens's radial direction.

The coordinate system of the lens unit 7 is the same as the XYZ orthogonal coordinate system of the exposure apparatus 1 described with reference to FIG. 1, where the Z axis is the same direction as the lens's optical axis, and the XY plane defines the lens's radial direction.

Figure 3:
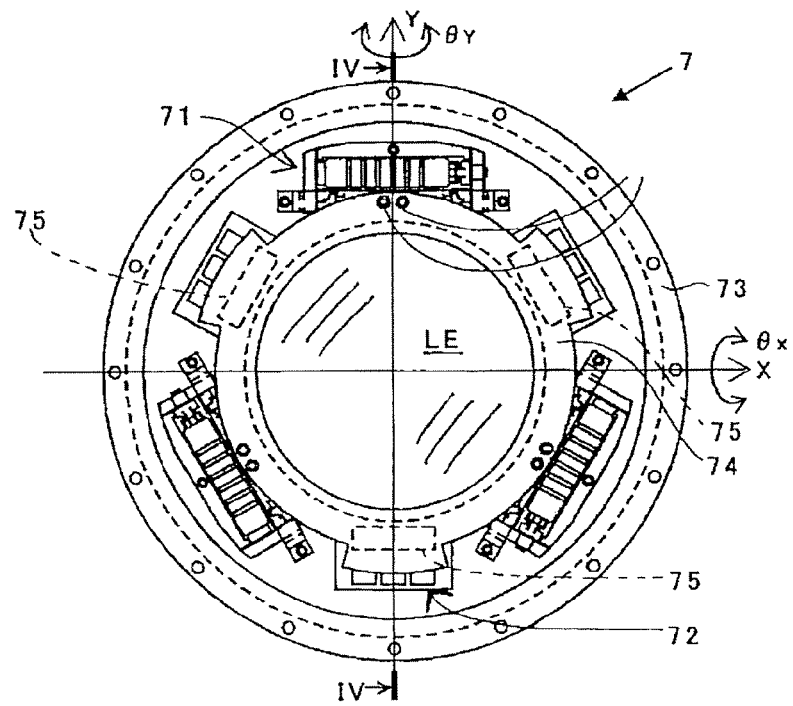
FIG. 3 is an explanatory view showing a structure of the lens unit shown in FIG. 2 to which a lens and a lens frame are attached.
Figure 4:
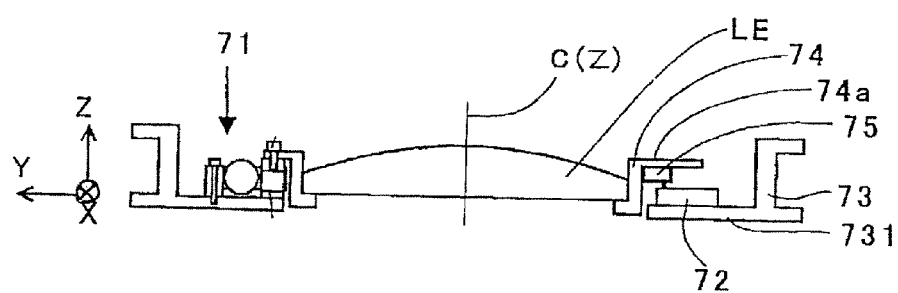
FIG. 4 is a sectional view taken along line IV-IV shown in FIG. 3.

FIG. 3 shows the lens unit 7 shown in FIG. 2 to which the lens frame 74 is attached. FIG. 4 is a section taken along a line IV-IV shown in FIG. 3. As shown in these figures, the fixture barrel 73 of the lens unit 7 has a sectional shape that has an inverse-L-shaped projection on the top surface of the plate. The lens LE is held on the lens frame 74, and the lens frame 74 is fixed onto the driving mechanism 71 via a screw and a bolt.

More specifically, the lens frame 74 that houses the lens LE has a flange part 74a on its top surface, and the flange part 74a is fastened with displacement output parts of the three sets of the driving mechanisms 71. A target mirror 75 used to detect a lens frame displacement is attached to this flange part 74a.

When the target mirror 75 is attached, the detection laser beam projected from the absolute-type perpendicular-displacement detecting sensor 721 or the incremental-type perpendicular-displacement detecting sensor 722 is reflected on the target mirror 75. A displacement amount of the target mirror 75 can be detected from the information of the reflected light.

This configuration can provide translational driving of the lens LE in the optical-axis C or Z-axis direction when the three sets of driving mechanisms 71 are driven by an equal amount. With a predetermined difference among driving amounts by the three sets of driving mechanisms 71, the lens LE can be tilted in the θx and θy directions shown in FIG. 3.

Closed loop control over the translational amount and tilt amount of the lens LE in the Z-axis direction is available with feedbacks of predetermined coordinate conversions to output signals from the absolute-type perpendicular-displacement detecting sensor 721 and the incremental-type perpendicular-displacement detecting sensor 722.

A reticle image's shift amount associated with parallel decentering of the lens LE in the X-axis and Y-axis directions is available based on an output signal of the incremental-type lateral-displacement detecting sensor 723. An alignment error of the reticle image associated with decentering of the lens LE can disappear when the influence of the calculation result is added to a driving amount of the wafer stage WF shown in FIG. 2.

Figure 5:
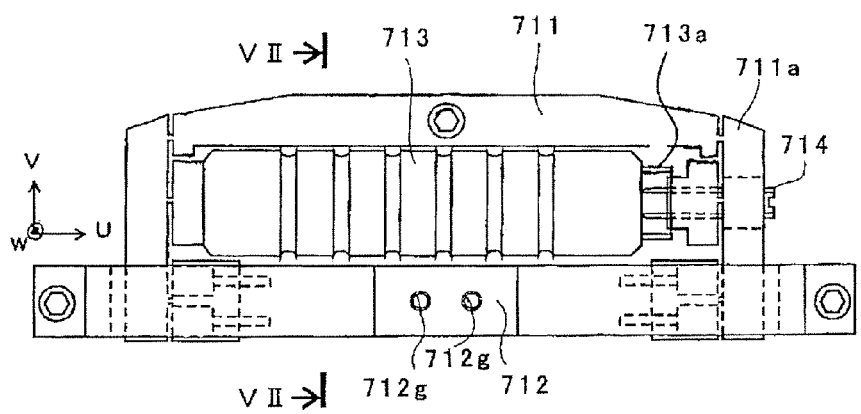
FIG. 5 is a plane view showing a detailed structure of a driving mechanism shown in FIG. 2.
Figure 6:
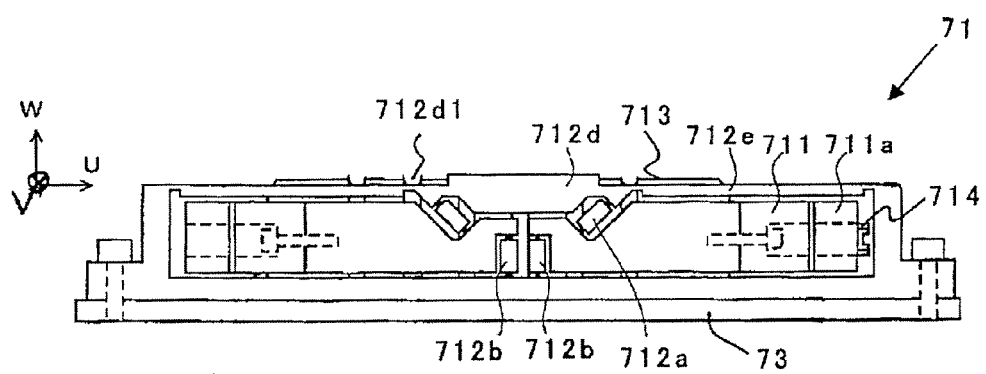
FIG. 6 is a side view showing a detailed structure of the driving mechanism shown in FIG. 2.
Figure 7:
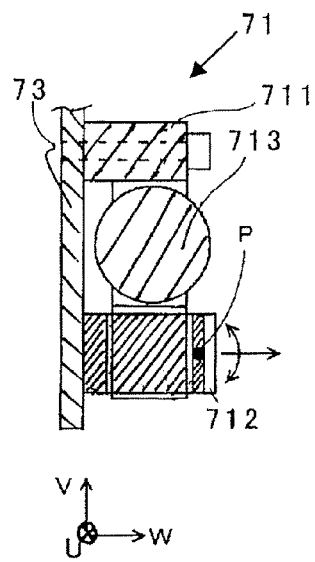
FIG. 7 is a sectional view taken along a line VII-VII shown in FIG. 5.
Figure 8:
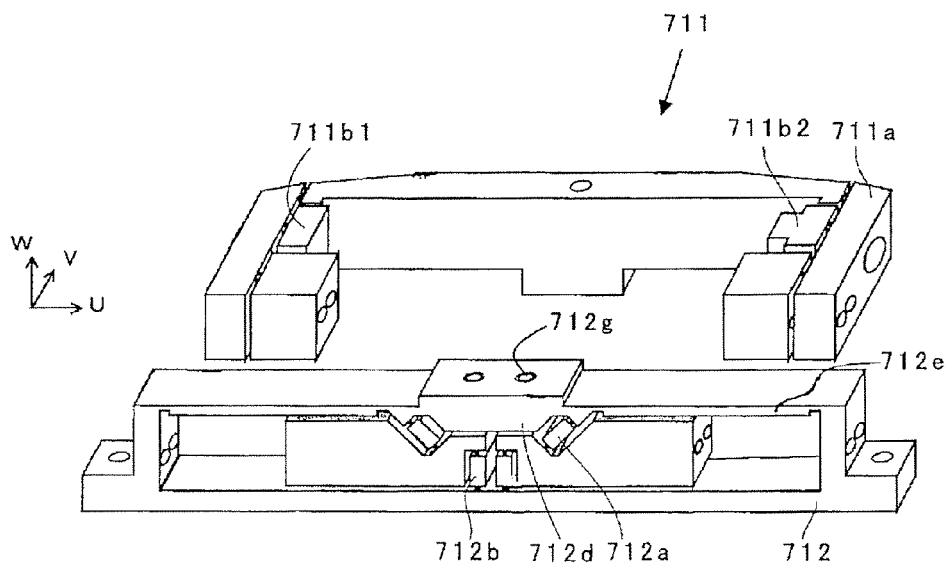
FIG. 8 is a perspective view showing a displacement pickup member and a direction converter.

FIGS. 5-8 show detailed structures of the driving mechanisms 71. FIG. 5 is a plane view of the driving mechanism 71. FIG. 6 is a side view of the driving mechanism 71. FIG. 7 is a sectional view taken along a line VII-VII shown in FIG. 5. FIG. 8 is a perspective view of the displacement pickup member and the direction converter, which will be described later. FIG. 8 omits various screws.

A local coordinate system UVW of the driving mechanism 71 is defined as follows: The U axis is an axis along a radial direction of the lens LE, the V axis is an axis along the radial direction of the lens LE and perpendicular to the U axis. The W axis is an axis parallel to the optical axis C of the lens LE.

As shown in these figures, the driving mechanism 71 includes a displacement pickup member 711, a direction converter 712, a lamination-type piezoelectric actuator 713, and fastening members, such as a screw, which connect these components, and is attached to the top of the fixture barrel 73 (shown in FIG. 6).

The piezoelectric actuator 713 has a rod member that is comprised of alternately laminated disc-shaped piezoelectric elements and electrodes and housed in a sealed cylindrical container. One end of the rod member projects from the container. An overall extension in the U-axis direction increases approximately in proportion to the applied voltage. The piezoelectric actuator 713 is connected to the displacement pickup member 711 using a piezoelectric adjusting screw 714.

A displacement of the piezoelectric actuator 713 in the U-axis direction is transmitted to the direction converter 712 via the displacement pickup member 711, and moves up and down the lens frame 74 in the W-axis direction. A size error of the piezoelectric actuator 713 can be corrected by adjusting the screwing depth of the piezoelectric adjusting screw 714 in the displacement pickup member 711.

The displacement pickup member 711 is manufactured by wire discharging to a plate metal block as a basic material having a predetermined thickness, and by forming screw holes at predetermined points through a piercing machine.

The direction converter 712 is manufactured, similar to the displacement pickup member 711, by wire discharging to a plate metal block as a basic material having a predetermined thickness so as to form a direction converting link 712a and a support link 712b, and by forming screw holes at predetermined points through a piercing machine.

A description will now be given of an assembly procedure of the driving mechanism 71. Initially, in the perspective view of FIG. 8, both side arms of the displacement pickup member 711 are inserted into left and right vacant spaces of the direction converter 712, and fastened through screws. Next, as shown in FIG. 5, the piezoelectric actuator 713 is attached in the space enclosed by the displacement pickup member 711 so as to push the piezoelectric receiving link 713a as an output end of the piezoelectric actuator 713 in the left direction using the piezoelectric adjusting screw 714. The displacement pickup member 711 is compressed against the piezoelectric link 713a Now, the attachment of the piezoelectric actuator 713 is finished. Finally, an assembly is completed when the driving mechanism 71 is installed in the annular fixture barrel 73.

Figure 9:
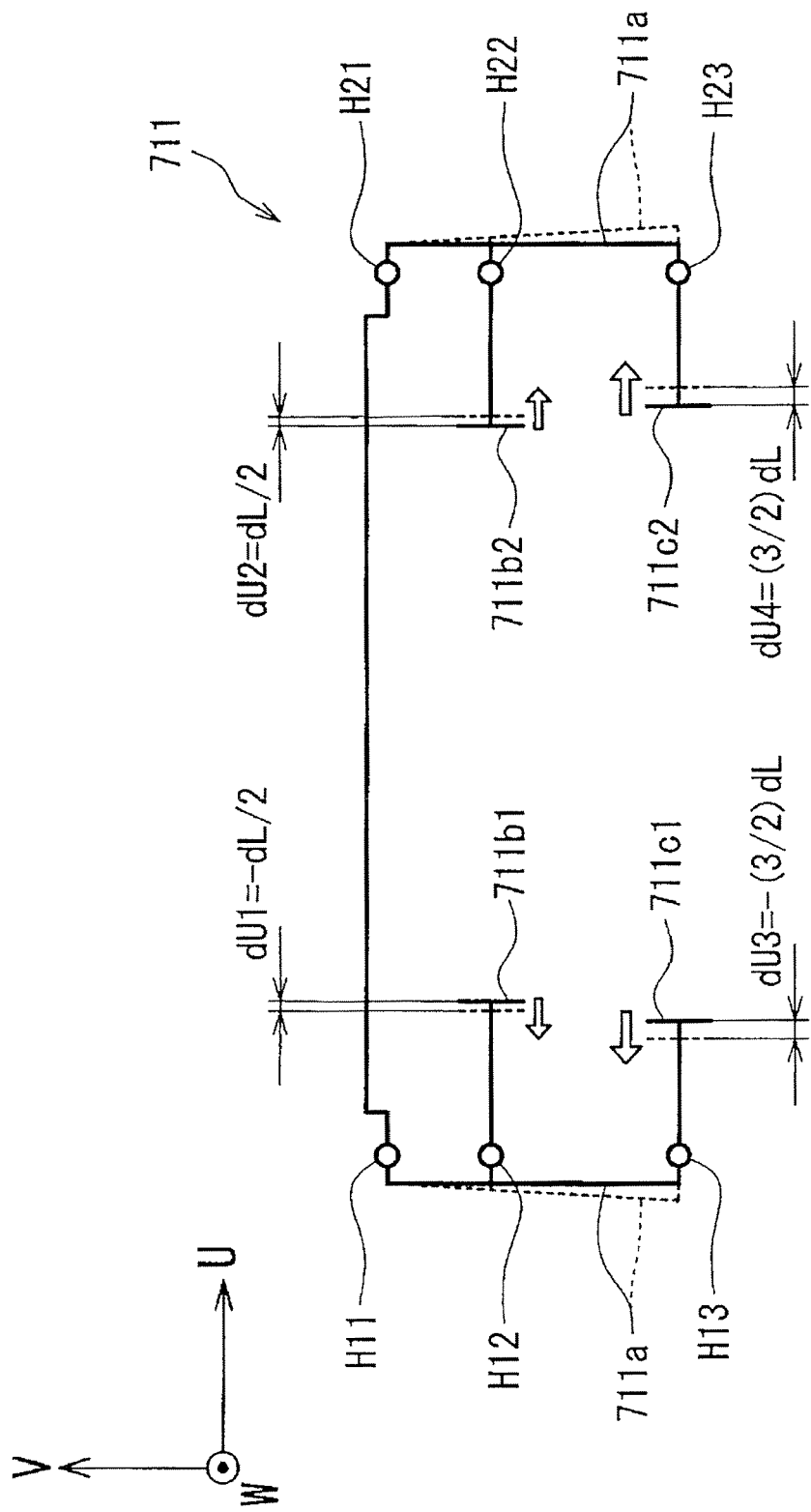
FIG. 9 is an explanatory view showing a linkage of the displacement pickup member.
Figure 10:
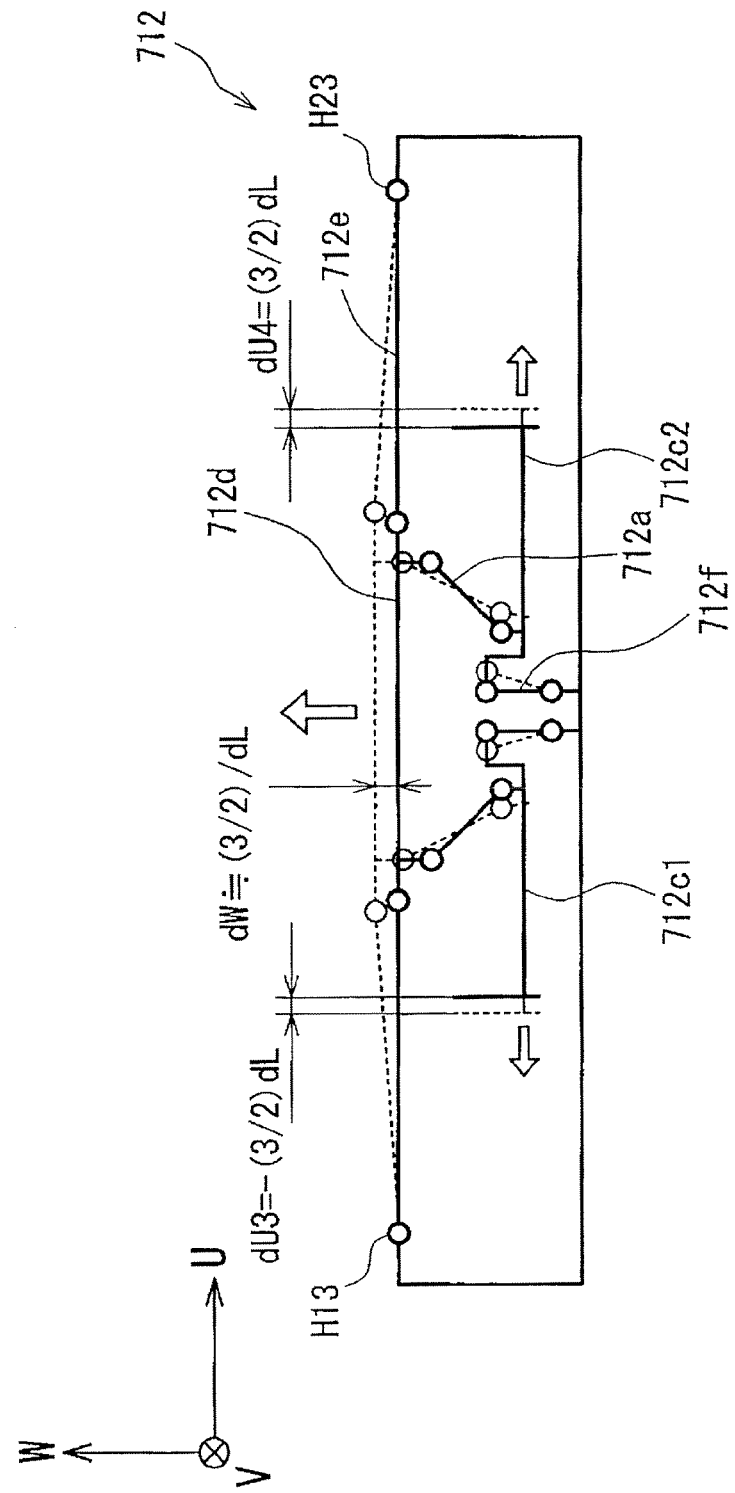
FIG. 10 is an explanatory view showing a linkage of the direction converter.

FIGS. 9 and 10 show linkages of the displacement pickup member 711 and the direction converter 712. FIG. 9 illustrates the displacement pickup member 711, and FIG. 10 illustrates the direction converter 712. Referring now to FIGS. 5 to 10, a description will be given of an operational principal of the driving mechanism 71.

When predetermined voltage is applied to two electrode terminals of the piezoelectric actuator 713, the span L of the piezoelectric actuator 713 extends by dL in the U-axis direction. Then, as shown in FIG. 9, one piezoelectric receiving link 711b displaces by dU1=−dL/2 and the other piezoelectric receiving link 711b 2 displaces by dU2=dL/2 Then, a displacement pickup member link 711a that is configured to rotate around the elastic hinges H11 and H21 rotates around the W axis. Thereby, a connection link 711c1 displaces by dU3=−(3/2)dL, and a connection link 711c2 displaces by dU4=(3/2)dL.

The displacements of the above connection links 711c1 and 711c2 in the U-axis direction also cause the displacements of horizontal links 712c1 and 712c2 in the direction converter 712 as shown in FIG. 10. Then, a direction conversion link 712 that is arranged to form 45° to the U axis minutely rotates, and ascends a lens frame driving link 712d in the W-axis direction by dW.

As discussed, while the lens frame driving link 712d displaces by a fine amount in the W-axis direction in association with the elongation of the piezoelectric actuator 713, the lens frame driving link 712d displaces only in the W-axis direction, does not displace in the U-axis or V-axis direction, because the support link 712e is connected to both left and right sides of the lens frame driving link 712d.

The support link 712e restricts a displacement of the lens frame driving link 712d in the U-axis direction, and a support link 712f restricts a displacement of the lens frame driving link 712d in the V-axis direction. This support link 712f is located at the direction converter center end of the horizontal links 712c1 and 712c2. The displacements of the horizontal links 712c1 and 712c2 in the U-axis direction are not restricted, and their displacements in the V-axis direction are restricted. Therefore, motions of the horizontal links 712c1 and 712c2 with no V-axis direction components are transmitted to the lens frame driving link 712d via the direction conversion link 712a.

This structure displaces, only in the W-axis direction, an area near a screw hole 712g (shown in FIG. 5) above the lens frame driving link 712d, and restricts displacements in the U-axis and V-axis directions. Therefore, the lens frame 74 can be precisely displaced in the W-axis direction. In addition, proper selections of the intervals among elastic hinges H11, H12, H13, H21, H22, and H23 would properly set a displacement enlargement ratio of the piezoelectric actuator 713.

On the other hand, as shown in FIG. 10, the lens frame driving link 712d is supported by the support link 712e at both sides, but is partially thin (see FIG. 6), and thin part 712d1 is elastically deformable in the twisting direction around the U-axis. The direction converter link 712a that restricts the lower side of the lens frame driving link 712d has slight elastic deformation degree of freedom in the V-axis direction.

The lens frame driving link 712d, as shown in FIG. 7, can be slightly twisted around the U axis around the point P at the center of the section of the support link 712e. The lens frame driving link 712d can provide a translation motion in the W-axis direction and a twisting motion around the U axis. This twisting motion causes the lens frame 74 to tilt.

Figure 11:
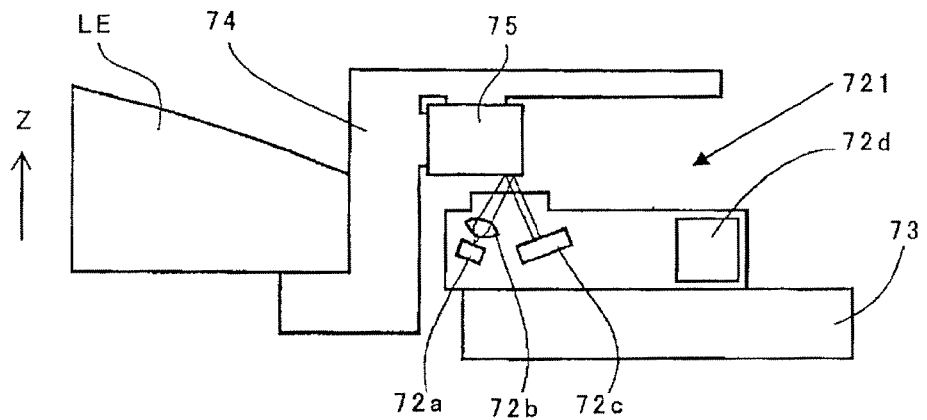
FIG. 11 is an explanatory view showing an absolute-type perpendicular-displacement detecting sensor.
Figure 12:
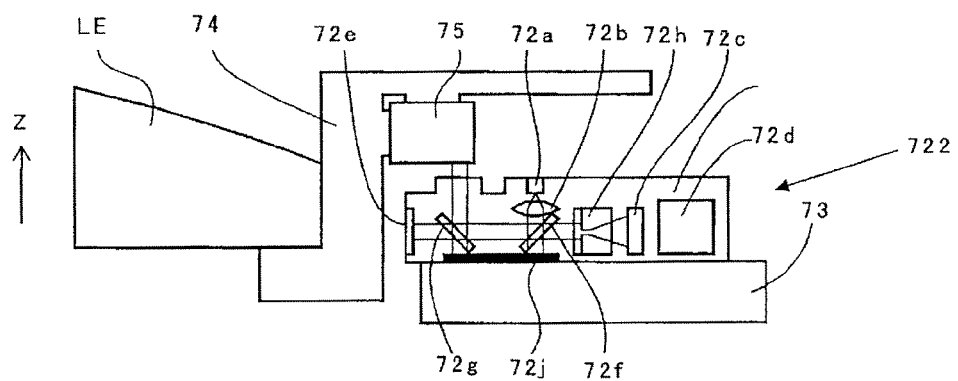
FIG. 12 is an explanatory view showing an incremental-type perpendicular-displacement detecting sensor.
Figure 13:
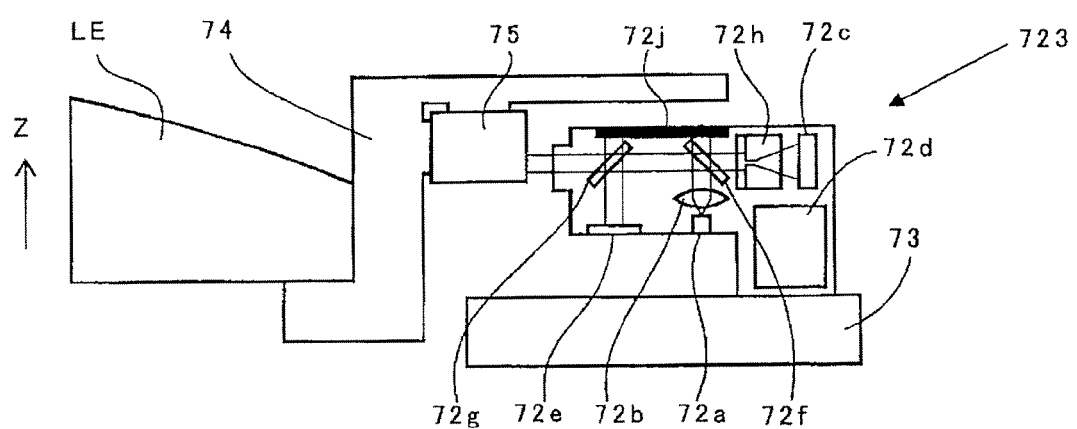
FIG. 13 is an explanatory view showing an incremental-type lateral-displacement detecting sensor.

FIGS. 11 to 13 show detailed structures of various sensors attached to the lens-position detector 72 shown in FIG. 2. FIG. 11 shows an absolute-type perpendicular-displacement detecting sensor 721. For example, it is preferable to use a triangulation laser measuring unit for the absolute-type perpendicular-displacement detecting sensor 721. The triangulation laser measuring unit observes a return position of the laser beam projected to the target mirror 75 as a target, and detects a position of the target mirror 75. One applicable illustration is disclosed in JP 10-267648. A description will now be given of a schematic structure and a position detection principal of the absolute-type perpendicular-displacement detecting sensor 721.

The absolute-type perpendicular-displacement detecting sensor 721 includes a laser light source 72a that irradiates a measurement semiconductor laser beam, a collimator lens 72b, and a quadrisection light-receiving member 72c that can detect a center-of-gravity position of the incident luminous flux. The quadrisection light-receiving member 72c is an optical position sensor (position sensitive detector: PSD), but may use a charged coupled device image sensor for the light receiving element. The sensor control circuit 72d drives the laser light source 72a, processes signals output from the quadrisection light-receiving member 72c, and executes various operations.

In the above configuration, the laser beam emitted from the laser light source 72a is incident as an approximately collimated luminous flux via the collimator lens 72b upon the target mirror 75, reflected on the target mirror 75, and then incident upon the light receiving surface of the quadrisection light-receiving member 72c. The quadrisection light-receiving member 72c outputs a signal according to a center-of-gravity position of the light-receiving spot, which changes as the target mirror 75 moves with the lens frame 74 in the Z-axis direction. Thus, the lens LE's displacement in the Z-axis direction can be detected when the sensor control circuit 72d calculates the center-of-gravity position.

Since the triangulation laser measuring unit can detect an absolute distance to a target to be detected, the Z coordinate of the lens LE to the reference point on the Z axis can be detected with the precision of submicron order, even when the power to the absolute-type perpendicular-displacement detecting sensor 721 is once cut and re-supplied.

FIG. 12 shows an incremental-type perpendicular-displacement detecting sensor 722. The incremental-type perpendicular-displacement detecting sensor 722 can preferably use an interference-type laser measuring unit. The interference-type laser measuring unit is an apparatus that allows the reflected light on the target mirror 75 as the target and the reflected light on the total-reflection mirror 72e in the incremental-type perpendicular-displacement detecting sensor 722 to blend and interfere with each other, counts the number of waves in the interference signal, and measures the moving amount of the target. One example of the interference-type laser measuring unit is a position detecting unit disclosed in JP 11-94514. A description will now be given of a schematic structure and a position detection principle of the incremental-type perpendicular-displacement detecting sensor 722.

This incremental-type perpendicular-displacement detecting sensor 722 includes a laser light source 72a that emits a measurement semiconductor laser beam, a collimator lens 72b, a quadrisection light-receiving member 72c, and a sensor control circuit 72d, a total reflection mirror 72e, a non-polarization beam splitter 72f, a polarization beam splitter 72g, an interference optical element 72h, and a light absorber 72j.

In the above configuration, the laser beam emitted from the laser light source 72a is shaped to a modestly condensed luminous flux (that is indicated as a collimated luminous flux in FIG. 12) via the collimator lens 72b, and incident upon the non-polarization beam splitter 72f. 50% of the incident luminous flux transmits the non-polarization beam splitter 72f and reaches the light absorber 72j so as to be absorbed. Remaining 50% of the incident light is reflected on the non-polarization beam splitter 72f, travels to the left, and enters the polarization beam splitter 72g.

The s-polarized luminous flux reflected on the surface of the polarization beam splitter 72f is incident upon the target mirror 75, and reflected on the target mirror 75, again reflected on the surface of the polarization beam slitter 72g, and returns to the non-polarization beam splitter 72f through the original optical path. On the other hand, the p-polarized luminous flux that has transmitted through the polarization beam splitter 72g is incident upon and reflected on the total reflection mirror 72e, retransmits the polarization beam splitter 72g, and returns along the original optical path.

This structure allows the polarization beam splitter 72g to synthesize the s-polarized reflected light from the target mirror 75 that is a moving target and the p-polarized reflected light from the total reflection mirror. 50% of the synthesized light transmits the non-polarization beam splitter 72f, and enters the interference-use optical element 72h. The interference-use optical element 72h includes, in order from the left incident plane side, a quarter waveplate, an aperture, a phase diffraction grating having a houndstooth check structure, and a quadrisection polarization plate with polarization azimuths shifted by 45°.

The synthesized light includes mutually orthogonal, linearly polarized beams, which are converted into circularly polarized beams that turn inversely by the quarter waveplate in the interference-use optical element 72h. Next, only the central luminous flux having a large light quantity passes via the aperture, and is amplitude-divided into four luminous fluxes by the phase diffraction grating having a houndstooth check before passing the quadrisection polarization plate. The quadrisection luminous fluxes generated by this course have been converted into interference beams having bright and dark shifted by 90° when converted into phase. The four luminous fluxes are incident upon the light receiving parts of the quadrisection light-receiving member 72c and the four output signals are processed as follows:

Initially, a difference between two signals having a phase difference of 180° is extracted to eliminate the DC component, and the resultant signal will be referred to as an A-phase signal. Similarly, a B-phase signal is generated by extracting a difference between the remaining two signals having a phase difference of 180° to eliminate the DC component. The A-phase signal and the B-phase signal have a phase difference of 90°, and provide a circular Lissajou's waveform when shown on an oscilloscope (see FIG. 18).

When an optical path change of the measuring light that reciprocates between the incremental-type perpendicular-displacement detecting sensor 722 and the target mirror 75 accords with the light source wavelength, the interference signal changes by one period. In other words, when the target moves by a distance of half a light source wavelength, the interference signal changes by one period. Where the measurement laser beam has a light source wavelength λ=800 nm, the interference changes by one period and the Lissajou's waveform goes round along the circular locus whenever the target mirror 75 moves by 400 nm. Therefore, when a known method measures the number of waves of the interference signal, the moving amount of the target can be detected at unit of 400 nm. When an electric phase divider is used to divide (frequency-divide) the interference signal, the moving amount of the target can be detected with sub-nanometer precision.

FIG. 13 shows the incremental-type lateral-displacement detecting sensor 723. The above incremental-type perpendicular-displacement detecting sensor 722 detects a perpendicular moving amount of the target mirror 75. On the other hand, the incremental-type lateral-displacement detecting sensor 723 detects a lateral moving amount of the target mirror 75, or a moving amount in the radial direction of the lens LE. Therefore, it is different in an arrangement of the internal optical element from the incremental-type perpendicular-displacement detecting sensor 722. However, the detecting principles of both sensors are the same, and thus a description thereof will be omitted.

Figure 14:
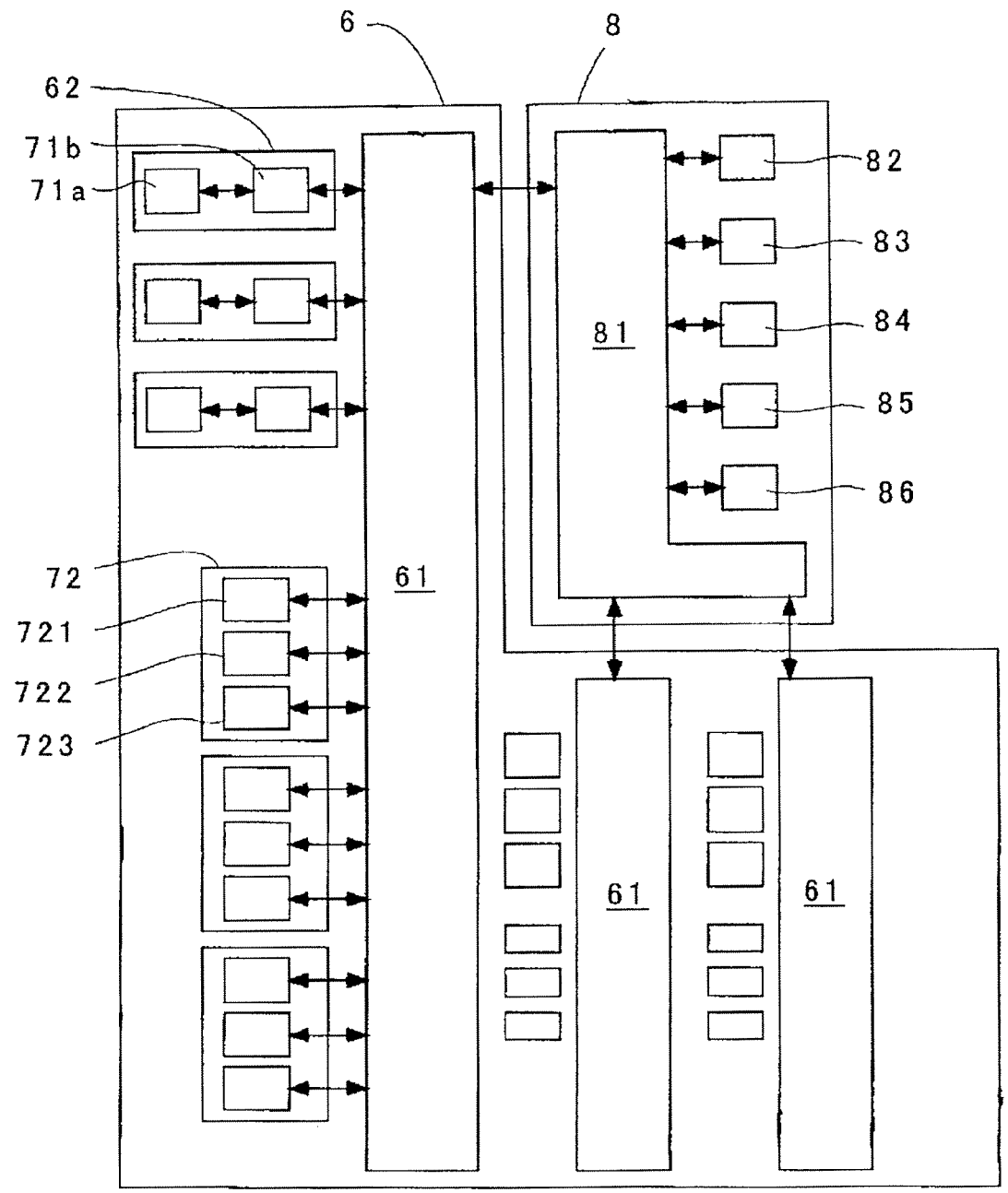
FIG. 14 is an explanatory view showing a control circuit used to control an exposure action and a lens driving action in an exposure apparatus.

FIG. 14 is a control circuit that controls the exposure action and the lens driving action of the semiconductor exposure apparatus shown in FIG. 1. As illustrated, the control circuit includes a body controller 8 that controls the entire exposure apparatus, and a lens controller 6 that controls a lens position. The body controller 8 includes a body CPU 81, to which a mount controller 82, an illumination controller 83, a reticle stage controller 84, a wafer stage controller 85, and an interferometer controller 86 are connected.

The mount controller 82 controls a vibration preventive action of the barrel mount 32. The illumination controller 83 controls the illumination mode and the light quantity of the illumination unit 4. The reticle stage controller 84 controls driving of the reticle stage R1. The wafer stage controller 85 controls driving of the wafer stage WF1. The interferometer controller 86 controls a measurement by the interferometer 51.

The lens controller 6 has three lens CPUs 61, and the lens CPU 61 is provided for each lens unit 7 shown in FIG. 1. In other words, the lens controller 6 has the same number of lens CPUs 61 as the number of lens units 7 provided to the projection optical system 2. Each lens unit 61 is connected to three driving mechanism controllers 62, and each driving mechanism controller 62 controls the driving mechanism 71 shown in FIG. 5. The driving mechanism controller 62 has a piezoelectric driving part 71a and a piezoelectric element 71b, and drives the piezoelectric actuator 713 shown in FIG. 5.

The lens CPU 61 is connected to three lens-position detectors 72. The lens-position detector 72 is provided with the absolute-type perpendicular-displacement detecting sensor 721, the incremental-type perpendicular-displacement sensor 722, and the incremental-type lateral-displacement detecting sensor 723.

In the above configuration, the lens CPU 61 communicates with the body CPU 81, and controls driving of the driving mechanism 71 based on a predetermined program so as to drive the lens toward a target position, and to minimize various aberrations of the projection optical system 2.

Figure 15:
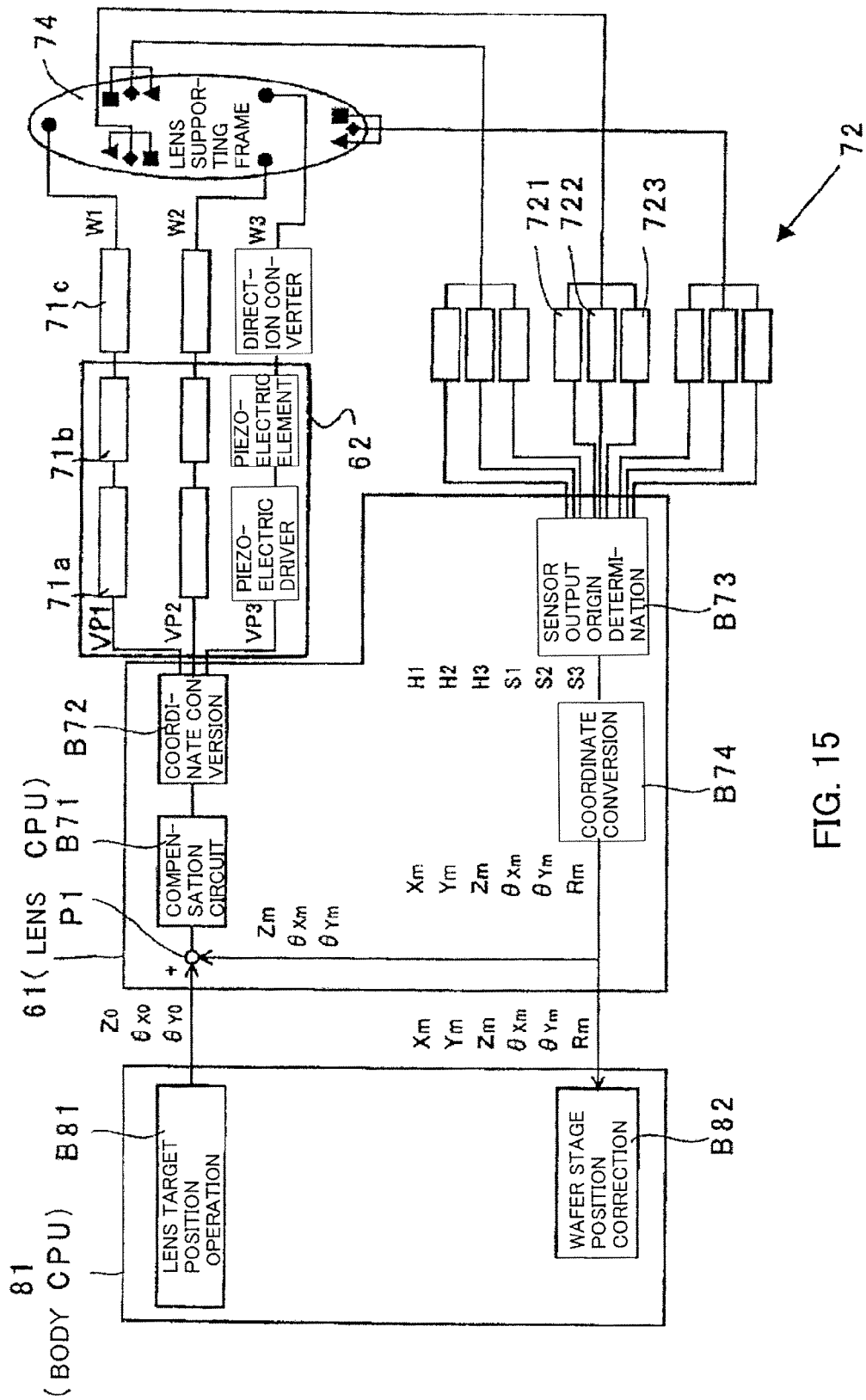
FIG. 15 is an explanatory view showing a control block in a lens unit.

FIG. 15 shows a control block of the lens unit 7. The lens target position operation block B81 in the body CPU 81 calculates a Z-axis direction driving target value Z0 of a lens reference point L0 and tilt driving target values θx0 and θy0, and sends the result to the lens CPU 61. The target value is input to an addition point P1 in the lens CPU 61.

At this addition point P1, feedback signal values Zm, θXm and θYm, which will be described later, are subtracted from the target values Z0, θX0 and θY0, and the residue signals are input into the compensation circuit block B71. The compensation circuit block B71 uses a P1 compensator so as to improve the control stability. A signal that has passed the compensation block B71 is input to a coordinate conversion block B72.

The coordinate conversion block B72 converts the residue signal into a piezoelectric driving voltage command value corresponding to the Z-axis direction driving target value Z0 of the driving mechanism 71. Assume that the driving target values of the lens LE are Z0, θx0 and θy0. Then, driving displacements W1, W2 and W3 of the driving mechanism 71 (see FIG. 16) can be calculated by multiplying the predetermined conversion matrix as given by Equation 1 below:

$$\begin{pmatrix} W1 \\ W2 \\ W3 \end{pmatrix} = \begin{pmatrix} C11 & C12 & C13 \\ C21 & C22 & C23 \\ C31 & C32 & C33 \end{pmatrix} \begin{pmatrix} Z0 \\ \theta X0 \\ \theta Y0 \end{pmatrix} \quad \text{EQUATION 1}$$

Therefore, the coordinate conversion block B72 may provide a conversion given by Equation 2 below so as to output a voltage value:

$$\begin{pmatrix} VP1 \\ VP2 \\ VP3 \end{pmatrix} = CV \begin{pmatrix} C11 & C12 & C13 \\ C21 & C22 & C23 \\ C31 & C32 & C33 \end{pmatrix} \begin{pmatrix} \delta Zo \\ \delta \theta X0 \\ \delta \theta Y0 \end{pmatrix} \quad \text{EQUATION 2}$$

$\delta Z0$, $\delta\theta X0$, and $\delta\theta Y0$ are control residues, VP1, VP2, and VP3 are control command voltage signals to the piezoelectric driving part 71a, and CV is a conversion coefficient to convert a displacement amount into control voltage.

When the control command voltage signal VP1, VP2, VP3 calculated by Equation 2 are input to the piezoelectric driving part 71a, the piezoelectric element 71b expands by a predetermined amount. The driving displacements W1, W2, and W3 are given to the lens frame 74 via the direction converter 71c that includes the displacement pickup member 711 and the direction converter 712 of the driving mechanism 71 so as to move the lens frame 74 and the lens to desired positions.

Then, three sets of lens-position detectors 72 measure a displacement amount of the target mirror 75 (see FIGS. 11 to 13) fixed onto the lens frame 74, and input totally nine types of measurement signals to a sensor output origin determination block B73. The nine types of measurement signals include a blend of an absolute position signal as a non-incremental displacement signal and an incremental displacement signal, and can be decomposed, as shown in FIG. 16, perpendicular displacements H1, H2, and H3 as absolute displacement components in the optical-axis C direction, and horizontal displacements S1, S2, and S3 as absolute displacement components in the lens radial direction.

Figure 16:
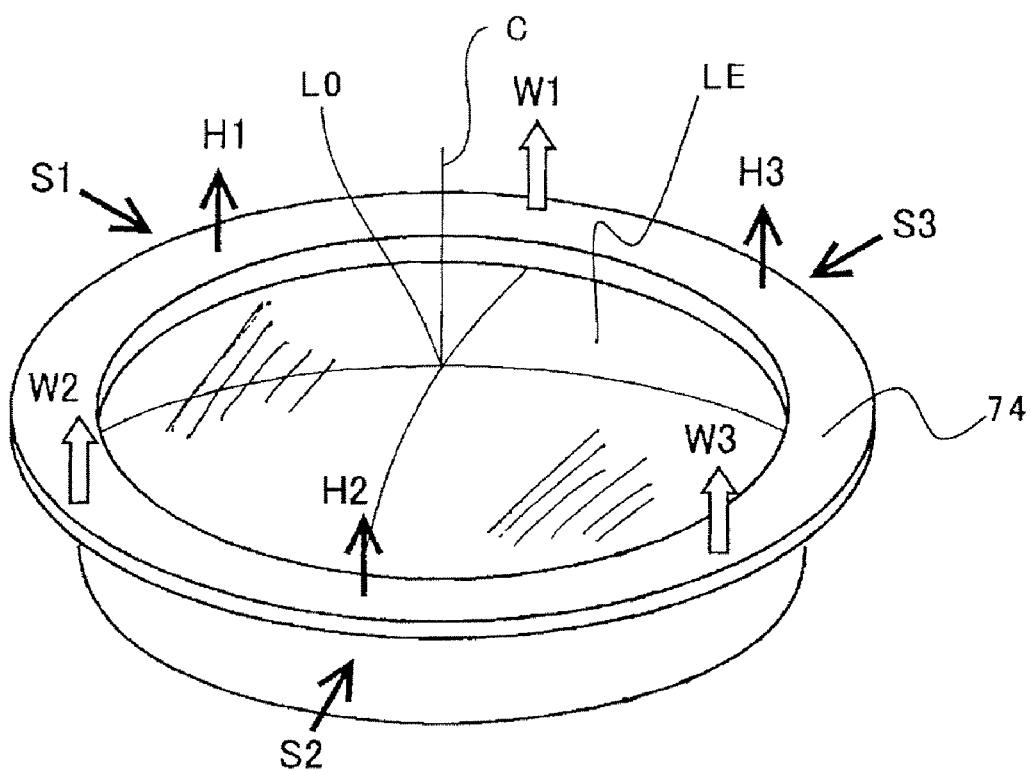
FIG. 16 is an explanatory view showing a coordinate definition and moving amount at each location on a lens frame, when the driving mechanism and the lens-position detector are located near the lens.

Referring now to FIG. 16, a description will be given of a coordinate definition and a moving amount at each location on the lens frame 74. As illustrated, the flange part 74a of the lens frame 74 that holds the lens LE is fastened to the displacement output part of the three sets of the driving mechanisms 71 (shown in FIG. 2) arranged at 120° intervals. Assume that W1, W2, and W3 are perpendicular driving displacements of the three driving mechanisms 71. Then, the three locations of the flange part 74a move by W1, W2, and W3 along the optical-axis C direction.

The lens-position detectors 72 (shown in FIG. 2) are arranged in the flange part 74a among the driving mechanisms 71. Assume that H1, H2, and H3 are perpendicular displacements of the three sets of lens-position detectors 72, and S1, S2, and S3 are their horizontal displacements. Then, as illustrated, displacements H1, H2, H3, S1, S2, and S3 at three locations of the flange part 74a are detected.

Figure 17:
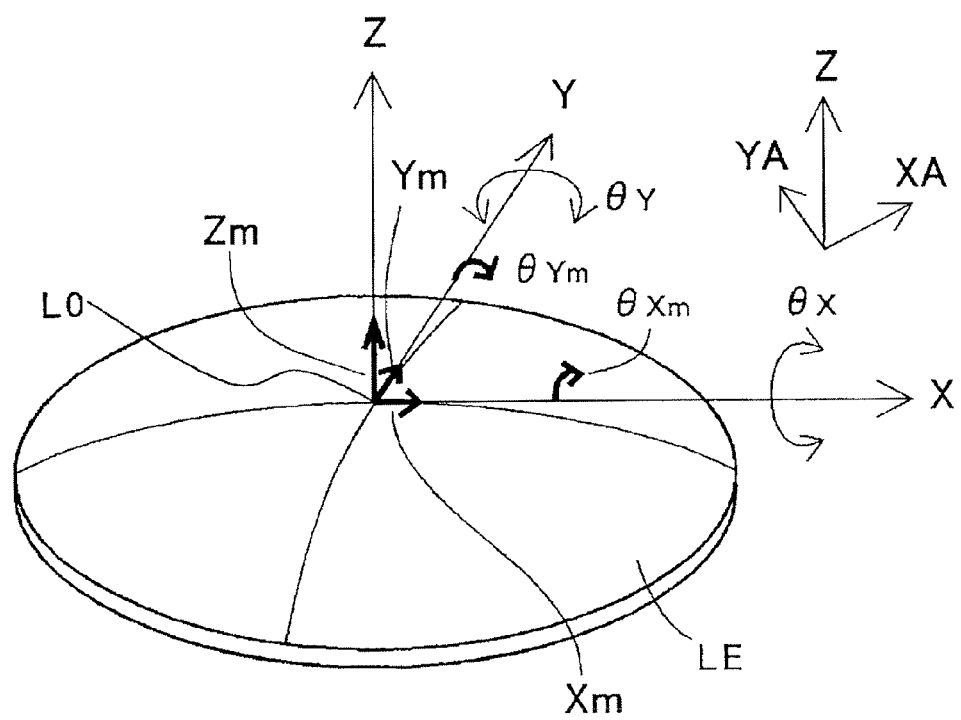
FIG. 17 is an explanatory view showing a lens coordinate definition of a lens in controlling a lens position.

FIG. 17 defines a lens coordinate or the XYZ orthogonal coordinate in controlling a position of the lens LE, in which a coordinate origin is a center on the incident plane (or a vertex of the lens first plane) when the lens LE is placed at the design reference position. The Z axis is the optical axis C. The X axis is a radial axis. The Y axis is a radial axis orthogonal to the X axis. The center of the incident plane of the lens LE is defined as a lens reference point L0 or a lens position representative point in the lens position control.

When three sets of driving mechanisms 71 are driven with the same driving displacement (W1=W2=W3), the lens reference point L0 provides a translation in the Z-axis direction and the displacement amount is expressed as Zm. When the driving mechanisms 71 are driven so that the displacement amounts of the three sets of driving mechanisms 71 can differ, the lens LE tilts and displaces around the X axis or Y axis in accordance with the relative change of the driving amount of the three sets of driving mechanisms 71. The tilt displacement amounts are the $\theta Xm$ direction and the $\theta Ym$ direction as shown in the figure.

In general, a tilt center of the lens LE to be tilted does not accord with the lens reference point L0, and the translational displacement (lateral shift) in the Y-axis direction occurs with a tilt around the Y axis, and the translational displacement (lateral shift) in the X-axis direction occurs with a tilt around the X axis. These lateral shift displacements will be referred to as Ym and Xm.

Next, turning back to FIG. 15, the coordinate conversion block B74 converts six types of displacement information calculated in the above steps into the positional coordinate of the lens LE. The pre-conversion measurement values H1, H2, H3, S1, S2, and S3 of the lens LE, and the coordinate values (post-conversion measurement values) Xm, Ym, Zm, $\theta Xm$, $\theta Ym$, and Rm of the lens reference point L0 can be mutually converted to each other using a predetermined conversion matrix, and correlated by Equation 3 below:

$$\begin{pmatrix} Xm \\ Ym \\ Zm \\ \theta Xm \\ \theta Ym \\ Rm \end{pmatrix} = \begin{pmatrix} K11 & K12 & K13 & K14 & K15 & K16 \\ K21 & K22 & K23 & K24 & K25 & K26 \\ K31 & K32 & K33 & K34 & K35 & K36 \\ K41 & K42 & K43 & K44 & K45 & K46 \\ K51 & K52 & K53 & K54 & K55 & K56 \\ K61 & K62 & K63 & K64 & K65 & K66 \end{pmatrix} \begin{pmatrix} H1 \\ H2 \\ H3 \\ S1 \\ S2 \\ S3 \end{pmatrix} \quad \text{EQUATION 3}$$

Totally five post-conversion measurement values Xm to $\theta Ym$ have been discussed. Rm is a value relating to a diameter size of the lens frame 74. In this embodiment, some of the coefficients in the conversion matrix become substantially zero as expressed by Equation 4 below:

$$\begin{pmatrix} Xm \\ Ym \\ Zm \\ \theta Xm \\ \theta Ym \\ Rm \end{pmatrix} = \begin{pmatrix} 0 & 0 & 0 & K14 & K15 & K16 \\ 0 & 0 & 0 & K24 & K25 & K26 \\ K31 & K32 & K33 & 0 & 0 & 0 \\ K41 & K42 & K43 & 0 & 0 & 0 \\ K51 & K52 & K53 & 0 & 0 & 0 \\ 0 & 0 & 0 & K64 & K65 & K66 \end{pmatrix} \begin{pmatrix} H1 \\ H2 \\ H3 \\ S1 \\ S2 \\ S3 \end{pmatrix} \quad \text{EQUATION 4}$$

That is, the lens's Z-axis direction translational displacement Zm, and tilt displacements $\theta Xm$ and $\theta Ym$ are calculated by the perpendicular displacements H1, H2, and H3 as the absolute displacements in the measured Z-axis direction, and do not depend upon the horizontal displacements S1, S2, and S3 as the absolute displacement in the lens radial direction. In addition, displacements Xm and Ym of the lens LE in the direction orthogonal to the Z axis and the lens frame 74's diameter size Rm are calculated by the horizontal displacements S1, S2, and S3 as the absolute displacements in the lens radial direction, and do not depend upon the perpendicular displacements H1, H2, and H3 as the absolute displacements in the measured Z-axis direction. In other words, a displacement component in a direction having a control degree of freedom is detected by a sensor having detection sensitivity in the Z-axis direction, and a displacement component in the direction having no control degree of freedom is detected by a sensor having detection sensitivity in a direction orthogonal to the Z-axis direction. The degree of freedom is the number of independent determinations (or independently determinable coordinate combinations in some cases) in the coordinate of the object (all mass points in the system). The control or driving degree of freedom is the number of coordinates or coordinate combinations to be controlled or driven among independently determinable coordinate combinations.

The pre-conversion perpendicular displacements H1, H2, and H3 and various post-conversion displacements Zm, θXm and θYm are displacements obtainable by actively driving the optical element. On the other hand, the pre-conversion horizontal displacements S1, S2, and S3 and various post-conversion displacements Xm, Ym and Rm are secondary displacements that cannot be actively controlled.

Among the six post-conversion measurement values obtained in the above steps, the information necessary for the position control over the lens LE is three types, such as Zm, θXm and θYm. Therefore, control residues that are differences from the target values Z0, θX0 and θY0 can be input into the compensation circuit block B71 by inversely inputting these values into the addition point P1. When the piezoelectric actuator 713 is driven again so as to cancel the control residues, the lens LE can be precisely positioned.

On the other hand, six types of measured displacement information Xm, Ym, Zm, θXm, θYm and Rm are sent to the wafer stage position correction block B82 in the body CPU 81. Among the displacement information, Xm and Ym are used to reduce the overlay error of the reticle image, for example. This is because the overlay error of the reticle image occurs when the lens LE tilts and generates lateral shift displacements Xm and Ym.

The lateral shift displacements Xm and Ym change the aberration of the projection optical system as well as moving the reticle image formed on the wafer WF. When a scan displacement amount of the wafer stage WF1 is corrected based on Xm and Ym, the reticle image's positioning accuracy improves and the overlay error reduces on the wafer WF.

For example, Rm is used to detect a breakdown and variations with time of a size of the lens unit 7. A diameter of the lens frame 74 is originally invariable, and thus a failure in the lens unit 7 is determinable by determining whether the measurement value Rm changes greatly. In addition, if it is determined whether or not Rm changes by a fine amount, a size variation with time can be detected. A change of Rm by a fine amount would give an inference of the thermal expansions of the lens LE and the lens frame 74, a long-term change due to the metal life expiration, etc.

A description will now be given of an adjustment method of each sensor in the lens-position detector 72 in the lens unit 7. The adjustment covers waveform shaping of a periodic signal output from the incremental-type displacement detecting sensor or so-called Lissajou adjustments, and an adjustment to determine a measurement reference point of the incremental-type displacement detecting sensor based on an output value of the absolute-type displacement detecting sensor.

Figure 18:
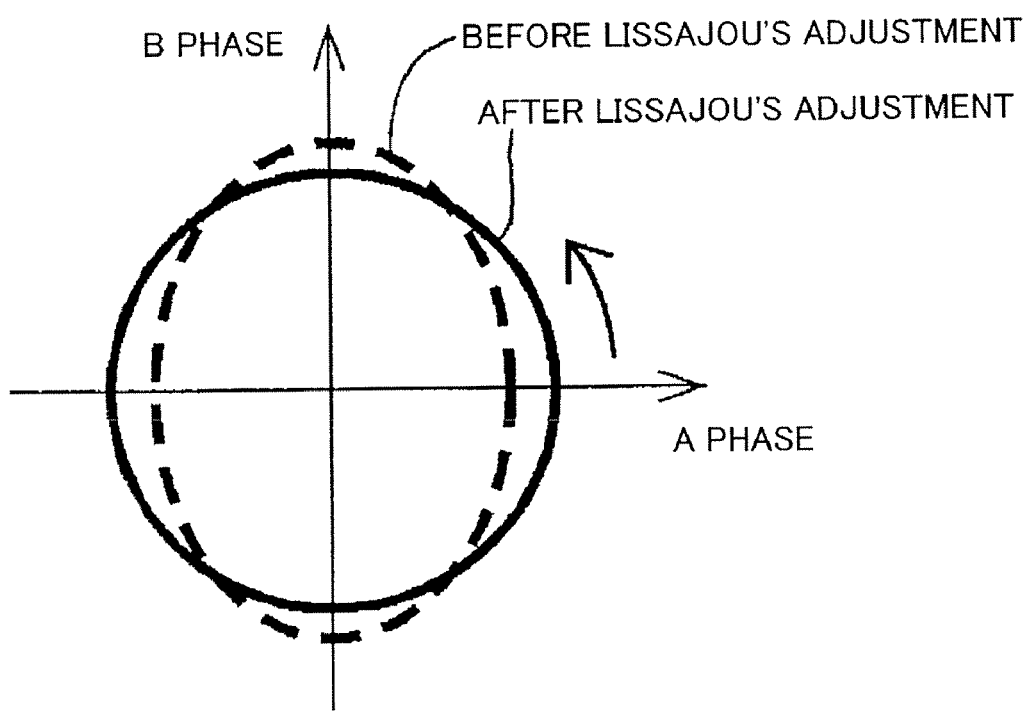
FIG. 18 is an explanatory view of a Lissajou's waveform.

Initially, a principle of the Lissajou adjustment will be discussed. The Lissajou adjustment is a pretreatment in operating a displacement signal from plural sine waves having different phases, and an adjustment used for waveform shaping of each sine wave. As shown in FIG. 18, the abscissa axis denotes the A-phase output of the interference signal calculated by the sensor control circuit 72d, and the ordinate axis denotes the B-phase output of the interference signal. Since the A-phase signal and the B-phase signal are sine waves that have the same output amplitude and a phase difference by 90°, the loci of both phases ideally form a circle when expressed on the two-dimensional plane. However, when each optical element in the sensor has a manufacturing error and quadrisection light-receiving portions have sensitivity differences, both AB phases may have different amplitudes, and the phase difference shifts from 90°, resulting, for example, in an elliptic locus as shown by a broken line. An electric frequency division of this elliptic locus does not provide a precise displacement signal due to the frequency division errors. In order to avoid this problem, a Lissajou adjustment unit (not shown) in the sensor control circuit 72d is used for the Lissajou adjustment or waveform shaping so that the Lissajou waveform becomes a circle (like a solid line in the figure).

A description will now be given of reference point scanning and the reference point determination method of the perpendicular displacement detecting sensor. In FIGS. 19A to 19D, the abscissa axis denotes a position of the lens LE in the Z-axis direction, and the ordinate axis denotes a displacement measurement value of the target mirror 75 in the Z-axis direction or the sensor output value. FIG. 19 shows that a (lower limit) position of the lens LE in the Z-axis direction accords with a design base position Hbtm1 when the driving mechanism 71 is powered off.

In this state, the voltage is applied to each of the piezoelectric actuators 713 in the three sets of driving mechanisms 71 to drive the lens LE in the Z-axis plus direction, an output value Habs of the absolute-type perpendicular-displacement detecting sensor 721 varies like a broken line. The sensor 721 is previously mechanically or electrically adjusted so that the lens LE can accord with a design ideal position or the optical origin or so that the sensor 721 can output a signal corresponding to an origin when the lens LE reaches the center in the movable range.

Thus, the sensor 721 can detect an absolute position of the target, but the linearity of the detection output is inferior to the incremental-type perpendicular-displacement detecting sensor 722 that is an optical interferometer. In other words, the output waveform (dotted line) of the absolute-type perpendicular-displacement detecting sensor 721 passes the origin 0 like Habs but is less linear than FIG. 19.

On the other hand, the incremental-type perpendicular-displacement detecting sensor 722 is superior to the absolute-type perpendicular-displacement detecting sensor 721 in the detection resolution and the linearity of the detection output. However, the sensor 722 can output a changing amount after it is powered, but cannot detect an absolute position of the target. Therefore, an output value Hinc becomes as shown by a solid line in FIG. 19B.

An output value Hinc0 of the incremental-type perpendicular-displacement detecting sensor 722 when the lens LE passes the origin is made accorded with an output value Habs0 of the absolute-type perpendicular-displacement detecting sensor 721, a reference point position of the detecting sensor 722 is determined. This action defines the origin of the incremental-type perpendicular-displacement detecting sensor 722 as the reference point Habs0 of the absolute-type perpendicular-displacement detecting sensor 721, enabling the absolute position of the target to be substantially detected.

Figure 19A:
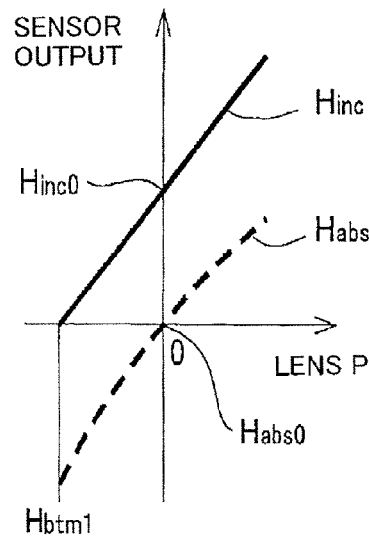
FIGS. 19A-D are explanatory views of reference point scanning and a reference point determination method of the perpendicular-displacement detecting sensor.
Figure 19B:
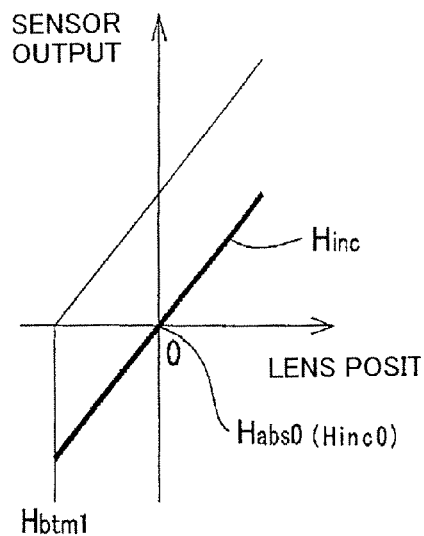
Figure 19C:
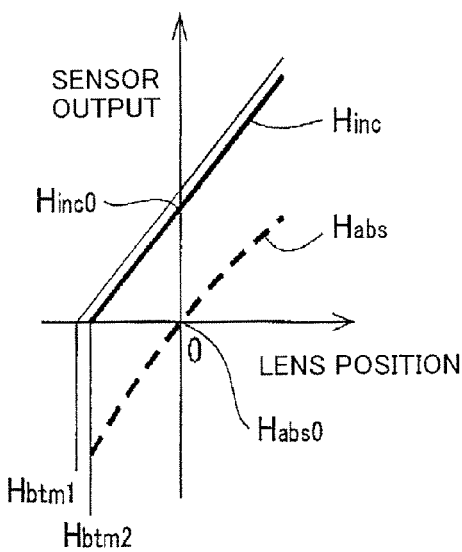

FIG. 19C shows that a position of the lens LE in the Z-axis direction (or the lower limit position or the base position) shifts by a fine amount from the design value Hbtm1 to Hbtm2 when the driving mechanism 71 is powered off. Conceivably, the lens's base position may shift due to a change of an initial length of the piezoelectric actuator 713 caused by a creep, a change of an initial length of the piezoelectric actuator 713 caused by an exchange, a change of a pilot pressure adjustment amount, etc.

The voltage is applied to piezoelectric actuator 713 at this state to drive the lens LE in the Z-axis plus direction. Then, the output value Habs of the absolute-type perpendicular-displacement detecting sensor 721 differs in its output start point from FIG. 19A, but its subsequent output signal accords with FIG. 19A and changes as shown by a broken line.

On the other hand, the incremental-type perpendicular-displacement detecting sensor 722 outputs a change amount after the power is supplied. If the base position of the lens LE shifts due to the above reasons, the output value Hinc indicated by a solid line differs from the output value Hinc indicated by a thin line (corresponding to the solid line in FIG. 19A).

Figure 19D:
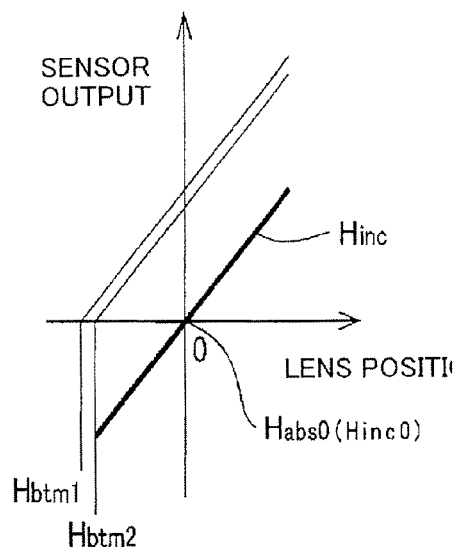

However, as discussed above, when the output value Hinc0 of the incremental-type perpendicular-displacement detecting sensor 722 when the lens LE passes the origin is made accorded with the output value Habs0 of the absolute-type perpendicular-displacement detecting sensor 721, the reference point position of the sensor 722 is defined. FIG. 19D shows this result, but in the above step, the origin of the incremental-type perpendicular-displacement detecting sensor 722 accords with the case shown in FIG. 19B.

The above adjustment defines a reference point of the incremental-type perpendicular-displacement detecting sensor 722, and the sensor 722 can serve as a precise absolute-type perpendicular-displacement detecting sensor 721.

Figure 20:
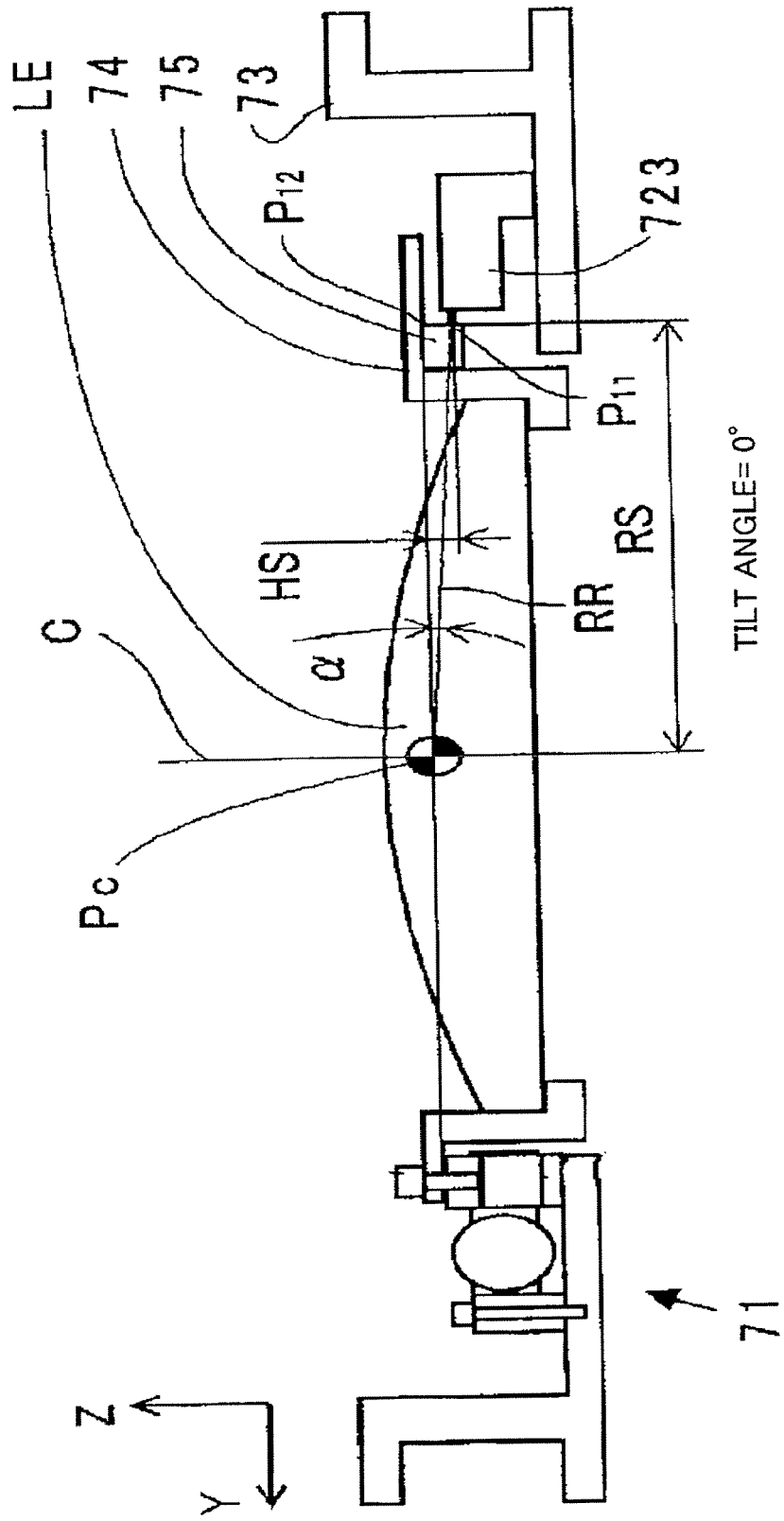
FIG. 20 is an explanatory view of an illustrative surface of a lens unit.
Figure 21:
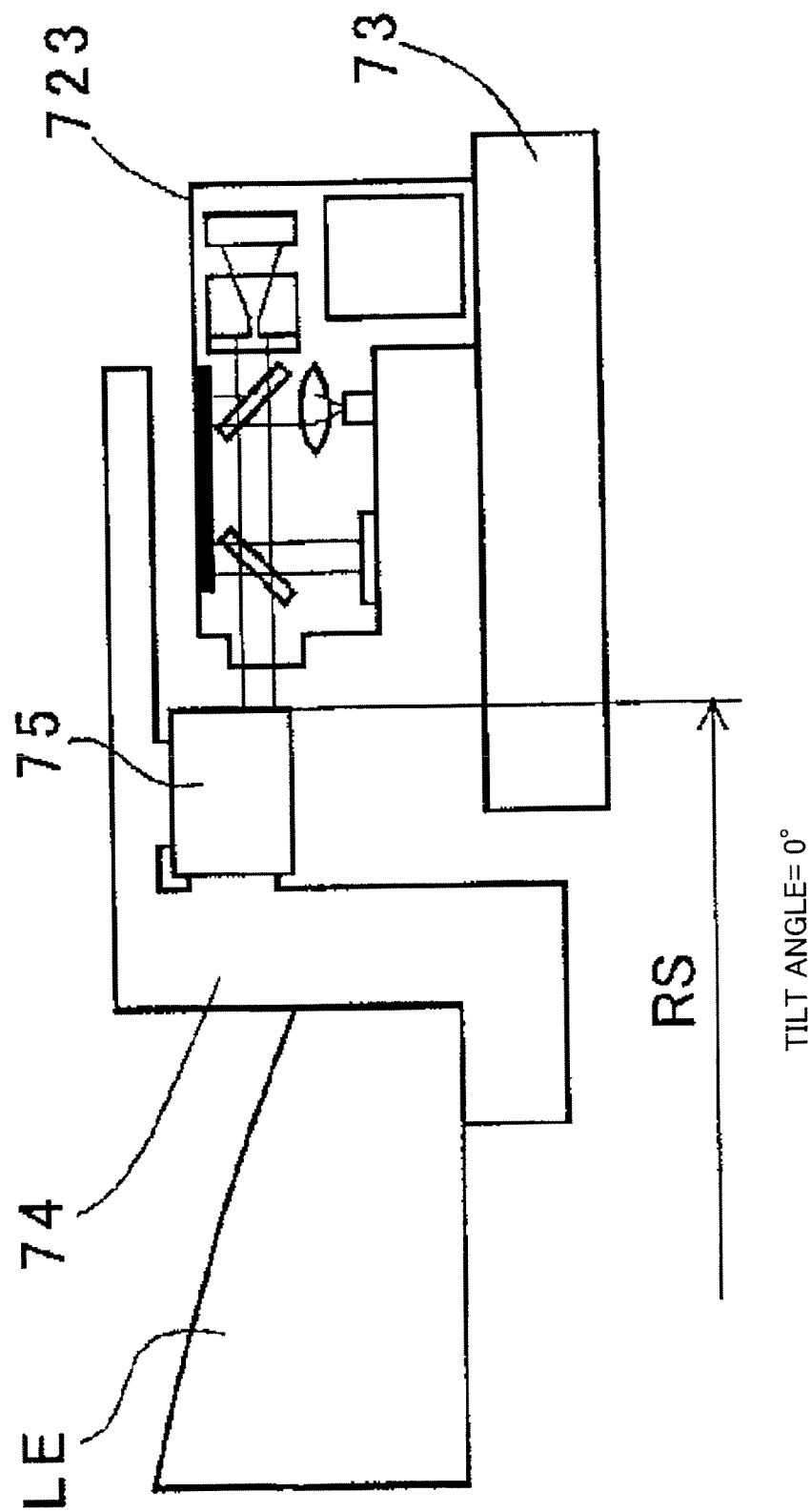
FIG. 21 is an enlarged view near the incremental-type lateral-displacement detecting sensor shown in FIG. 20.

A description will now be given of a displacement that secondarily occurs when the lens LE is tilted. FIG. 20 shows the lens LE before it is tilted around the X axis. FIG. 21 shows an enlarged view around the incremental-type lateral-displacement detecting sensor 723 shown in FIG. 20.

In order to tilt the lens LE counterclockwise around the X axis, it is necessary in the three driving mechanisms 71 in FIG. 3 to control output part of the upper driving mechanism 71 in the Z-axis minus direction, and its output parts of the lower right and lower left driving mechanisms 71 in the Z-axis plus directions. Referring to FIG. 16, the driving mechanisms 71 are controlled while −δW is assigned to the driving displacement W1 and +2δW is assigned to each of the driving displacements W2 and W3. No translation occurs at the lens reference point L0 in the Z-axis direction, and the lens LE is tilted only around the X axis.

The tilt center axis Pc of the lens LE is indicated as a point Pc in FIG. 20. The tilt center axis is located on the plane that passes the top surface (see FIG. 8) of the lens frame driving link 712d in the three sets of driving mechanisms 71, and approximately accords with an axis that intersects the optical axis C. The reason will be described below:

In FIG. 16, when the three sets of driving mechanism 71 have the same Z-axis direction driving displacement, the lens frame 74 translates in the Z-axis direction. On the other hand, when the three sets of driving mechanisms 71 have different Z-axis direction driving displacements, the lens frame driving link 712d (shown in FIG. 10) of each driving mechanism 71 translates in the Z-axis direction by different amounts, and the lens frame 74 consequently tilts. This tilt action causes the lens frame driving link 71 to which the lens frame 74 is fastened to have a compulsory inclination by an angle equal to the tilt angle.

In this case, as described with reference to FIG. 10, the support link 712e that restricts the lens frame driving link 712d has a twistable structure around the U axis. Thus, the lens LE can be tilted, and the tilt center axis Pc of the lens LE in FIG. 20 is located near the intersection between the optical axis C and the plane that includes the thin part 712d1 (shown in FIG. 16) of the support link 712e Here, the Z-axis direction height of the plane that includes the thin part 712d1 is approximately as high as the fastening plane between the lens frame driving link 712d and the lens frame 74.

When the lens LE is tilted in the lens unit 7, there is no fixed tilt center, defined by a bearing, and a pivot mechanism and so on, but the tilt center axis Pc of the lens LE is defined when part of the driving mechanism 71 has low distortion rigidity.

Figure 24:
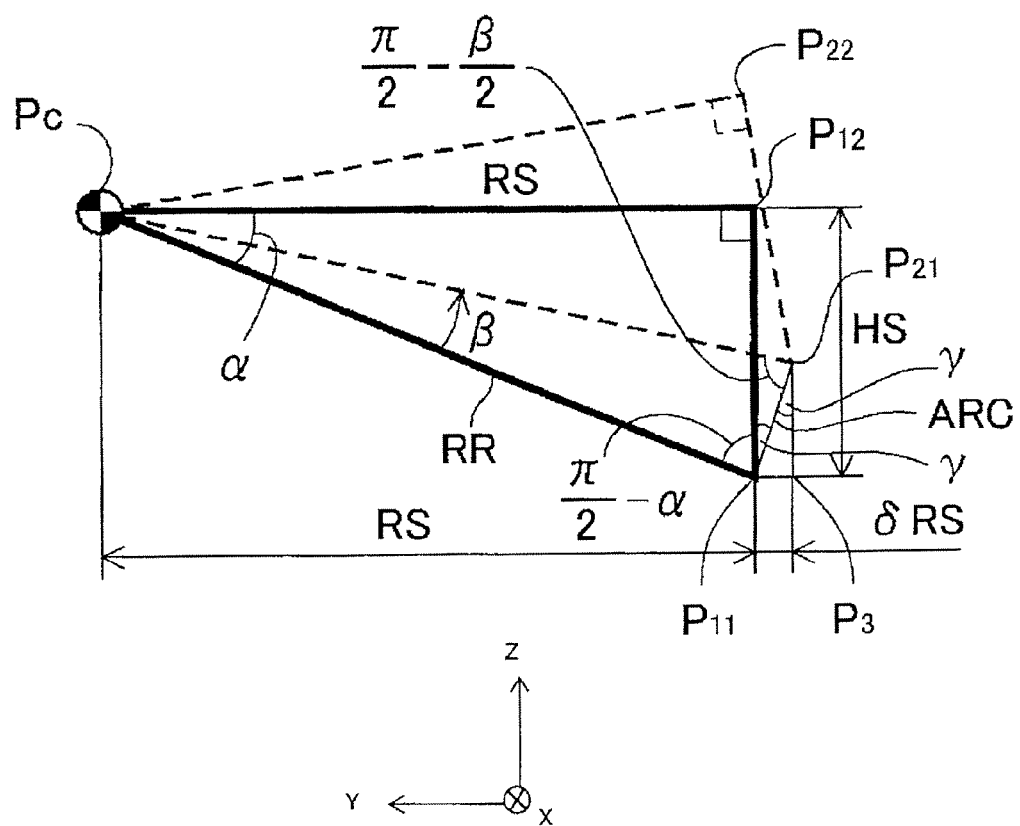
FIG. 24 is an explanatory view that mathematically shows changes before and after the lens is tilted.

A description will now be given of a lateral shift amount when the lens LE is tilted. In FIGS. 20 and 24, RR denotes a segment that connects the tilt center axis Pc to a displacement measurement point P11 of the incremental-type lateral-displacement detecting sensor 723 in the target mirror 75. A point P12 denotes an intersection between a horizontal that passes the tilt center axis Pc and a perpendicular that passes the displacement measurement point P11. These three points PC, P11 and P12 define a right triangle PcP11P12.

RS denotes a Y-axis direction component of the segment RR. HS denotes a Z-axis direction component of the segment RR. α denotes a relative angle between the horizontal that passes the tilt center axis Pc and the segment RR. FIG. 21 defines RS as a distance in the Y-axis direction between the tilt center axis PC and the reflection surface of the target mirror 75 onto which the measurement beam of the sensor 723 is projected.

Figure 22:
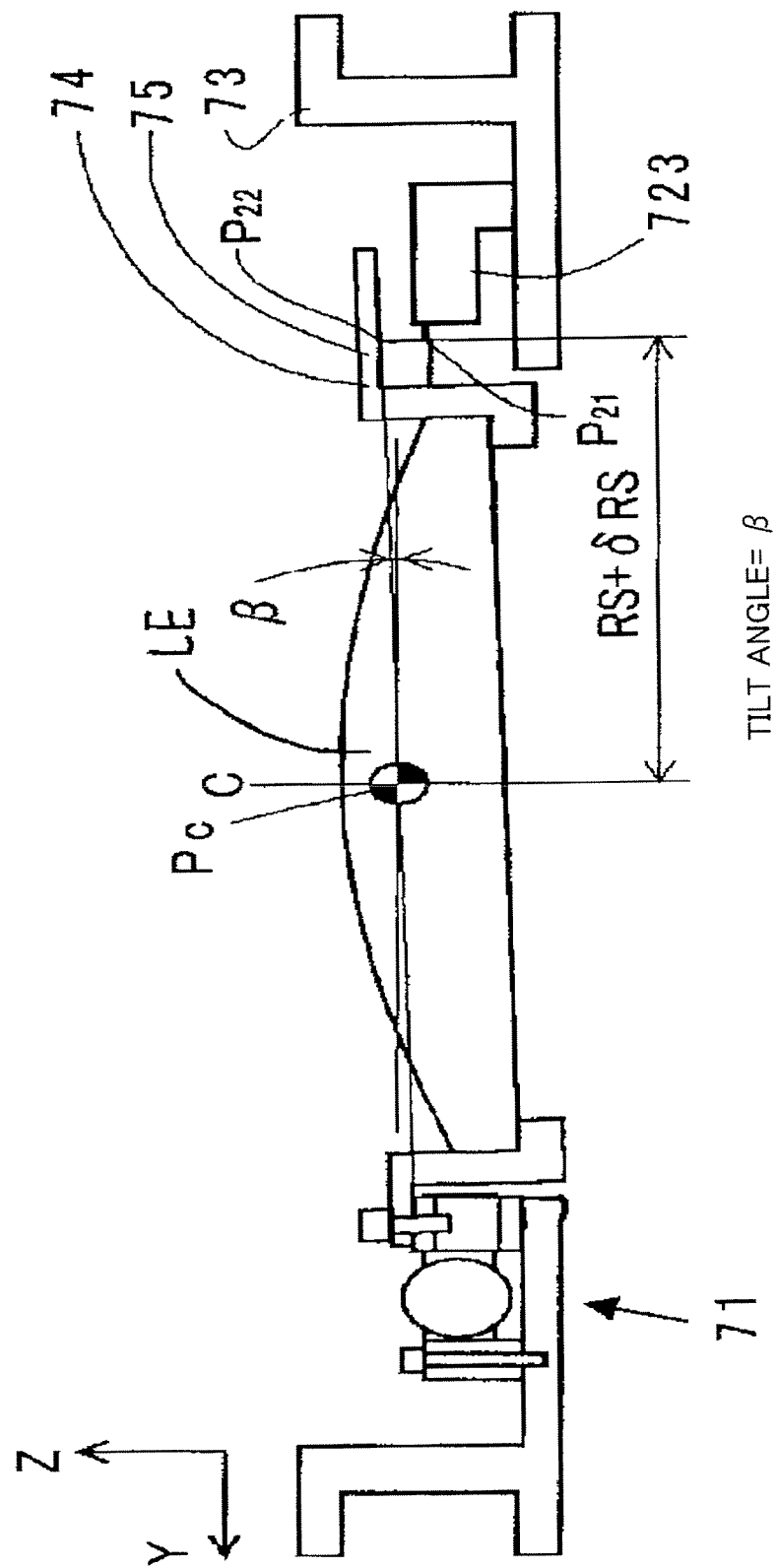
FIG. 22 is an explanatory view when the lens unit shown in FIG. 20 is tilted by an angle β.
Figure 23:
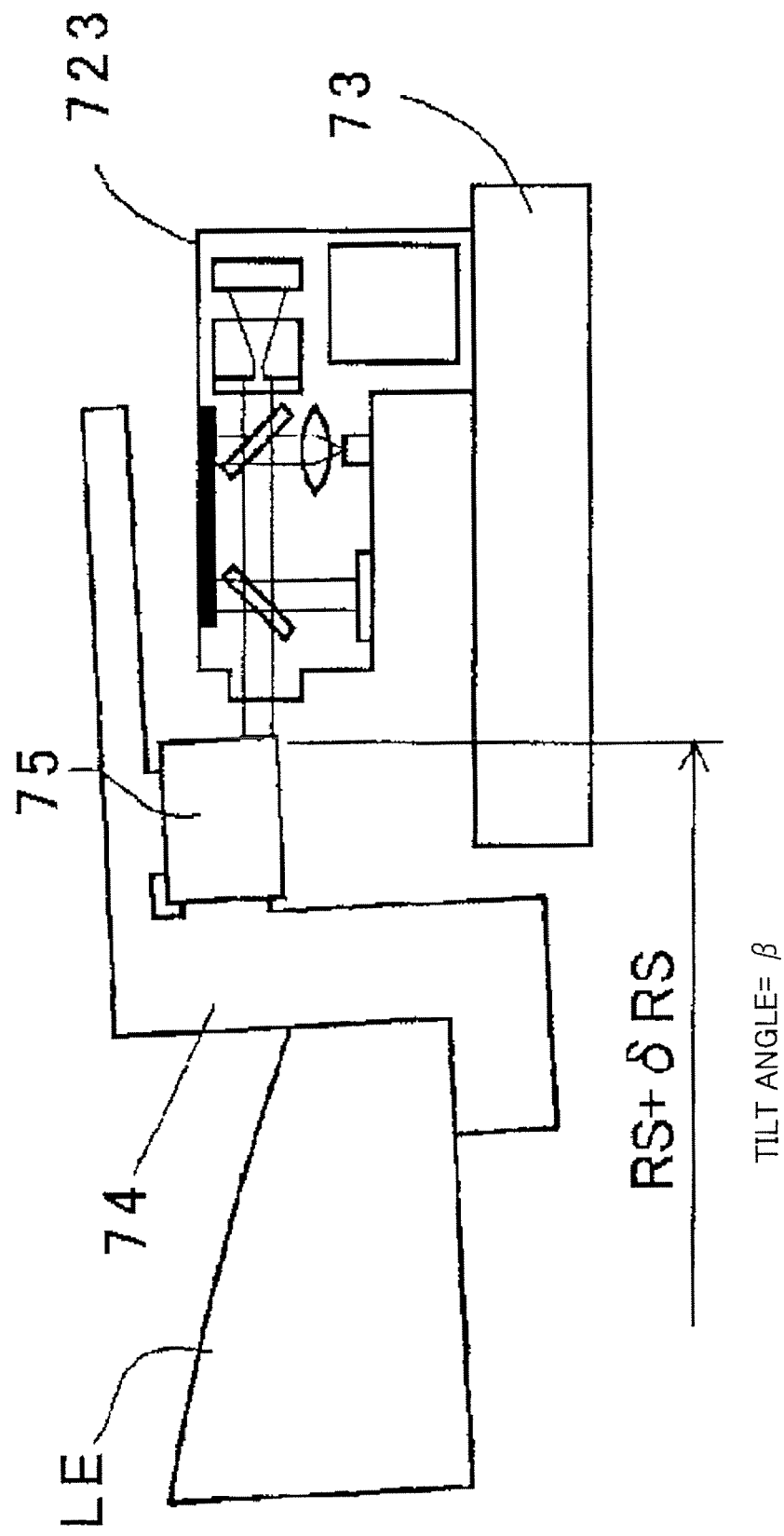
FIG. 23 is an enlarged view near the incremental-type lateral-displacement detecting sensor shown in FIG. 22.

FIG. 22 shows a section when the lens LE is tilted counterclockwise by an angle β, and FIG. 23 is an enlarged view near the incremental-type lateral-displacement detecting sensor 723 shown in FIG. 22. Along with the tilt displacement of the lens LE, the target mirror 75 displaces in the Z-axis plus direction and Y-axis minus direction (or the right directions in FIGS. 22 and 23) by a fine amount. Therefore, the right triangle PcP11P12 defined by FIG. 24 moves to a right triangle PcP21P22, and the Y-axis direction component RS between the measurement beam irradiation member P21 and the tilt center axis PC increases by δRS.

A description will now be given of the lateral shift amount δRS. FIG. 24 shows the right triangle PcP21P22 by a solid line before it is tilted, and the right triangle PcP21P22 by a broken line after it is tilted, but exaggerates the angle α for description purposes of δRS. ∠P11PcP12=α is met, and Equation 5 below is also met:

$$\sin\alpha = \frac{HS}{RR} \quad \text{EQUATION 5}$$

When the tilt angle β is fine where ARC denotes a segment that connects a pre-tilt vertex P11 to a post-tilt vertex P21, Equation 6 below is met:

$$ARC = RR \times \beta \quad \text{EQUATION 6}$$

When a distance δRS between P11 and P3 is a lateral shift amount of the target mirror 75 in the Y-axis direction caused by tilting of the lens LE, where P3 is an intersection between a horizontal that passes the point P11 and a perpendicular that passes the P21, where γ=∠P12P11P21=∠P3P21P11, Equation 7 below is met:

$$\delta RS = ARC \times \sin\gamma \quad \text{EQUATION 7}$$

Assume that the tilt angle β is a negligible fine angle to other angles, such as α, and address a basic angle of the isosceles triangle PcP11P21 shown in FIG. 24. Then, Equation 8 below is met:

$$\gamma = \left(\frac{\pi}{2} - \frac{\beta}{2}\right) - \left(\frac{\pi}{2} - \alpha\right) \quad \text{EQUATION 8}$$
$$= \alpha - \frac{\beta}{2} \approx \alpha$$

Equation 9 below is obtained by substituting Equation 8 for Equation 7 with Equations 5 and 6:

$$\delta RS = ARC \times \sin\alpha \quad \text{EQUATION 9}$$
$$= RR \times \beta \times \sin\alpha$$
$$= HS \times \beta$$

Assume that β is a tilt angle and HS is a Z-axis direction size between the detection beam position P11 of the incremental-type lateral-displacement detecting sensor 723 and the tilt center axis Pc of the lens LE. When the lens LE is tilted, a displacement (δRS) detection signal occurs in the sensor 723.

On the other hand, λ is a light source wavelength of the sensor 723. When a distance between the sensor 723 and the target mirror 75 changes by λ/2, an interference signal of the Lissajou's waveform for one period described with reference to FIG. 18 is obtained. Therefore, the Lissajou adjustment that uses the interference signal that occurs in the sensor 723 when the lens LE is tilted requires Equation 10 below to be met:

$$\delta RS > \frac{\lambda}{2} \quad \text{EQUATION 10}$$

Equation 11 is led from Equations 9 and 10:

$$HS > \frac{\lambda}{2\beta} \quad \text{EQUATION 11}$$

As one specific numerical example, HS>4(mm) is obtained when λ=800 (nm)=8×10−4 (mm) and β=1×10⁻⁴ (rad) are substituted for Equation 11. More specifically, this example uses an interference-type laser measuring unit having a light source wavelength λ=800 (nm) and a lens unit 7 having a characteristic of a maximum tilt angle β=1×10⁻⁴ (rad) for practical use in driving mechanism 71. The Lissajou adjustment of the measuring unit is available with a tilt action of the lens LE by spacing a measurement beam position of the measuring unit from the tilt center axis Pc of the lens LE by 4 (mm) or greater in the Z-axis direction.

On the other hand, when the lens LE is titled by the same tilt angle β around an axis parallel to the Y axis, a lateral shift position in the X-axis direction observed by the upper right and upper left lens-position detectors 72 shown in FIG. 2 is √3/2≈0.87 times as large as δRS calculated by Equation 6. Therefore, the Z-axis direction spacing amount HS calculated by Equation 11 needs about 1.15 times or 4.6 (mm) or more spacing. In addition, the precise Lissajou adjustment described with reference to FIG. 18 preferably requires about two periods of the interference signal. Therefore, with the foregoing in mind, it is preferable to secure double or more spacing amount for the spacing amount HS calculated by Equation 11.

Figure 25:
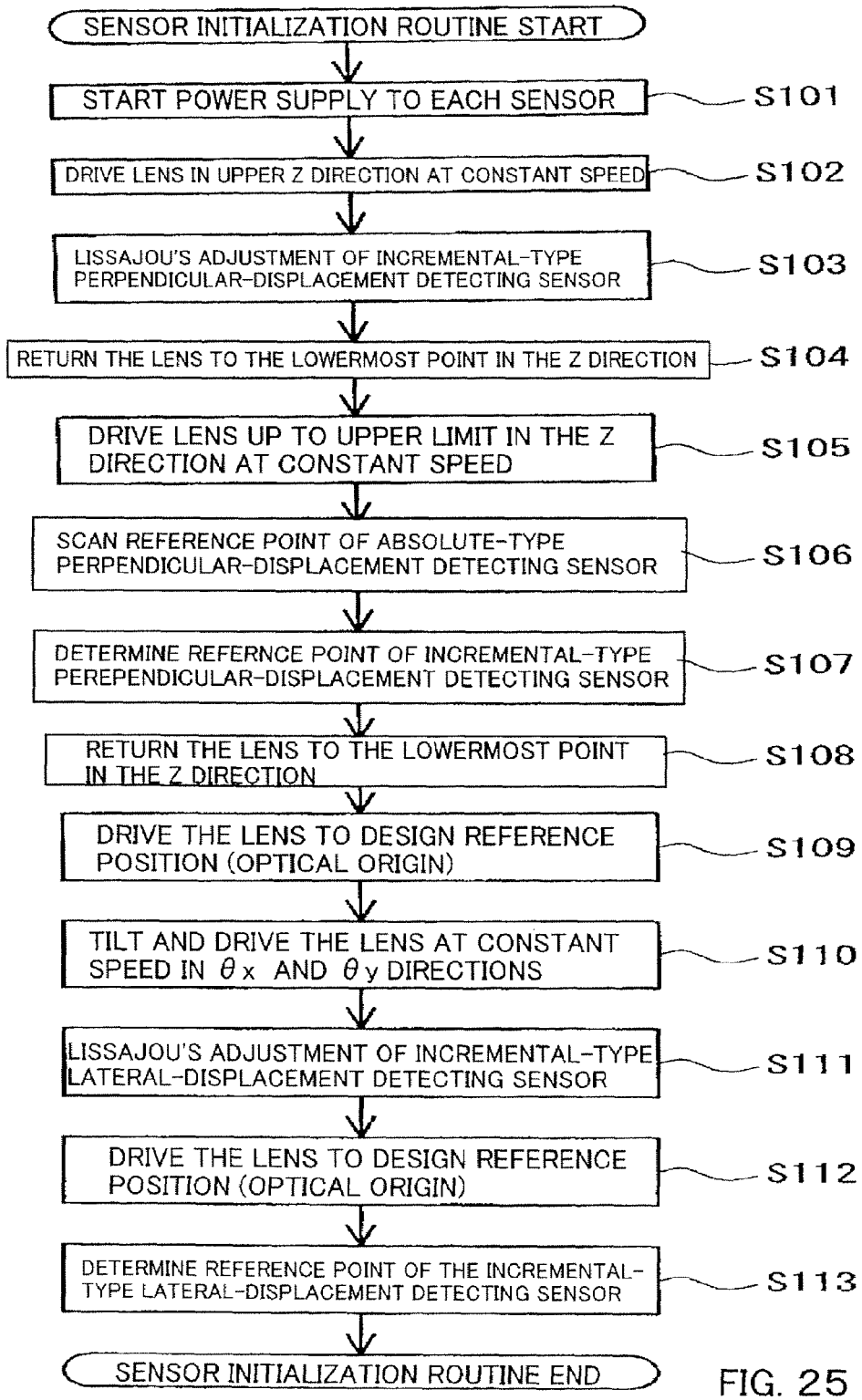
FIG. 25 is a flowchart of a sensor initialization routine for an adjusting step of each sensor shown with reference to FIGS. 18-24.

FIG. 25 shows a flowchart of a sensor initialization routine in executing the adjusting step of various detecting sensors 721, 722, and 723. Initially, the step S101 starts power supplies to the various detecting sensors 721, 722 and 723 in the lens-position detector 72 to render a lens position measurable state. Since none of the three sets of driving mechanisms 71 have not yet been activated in this step, the lens LE is located at the base position or the lowermost position in the movable range in the Z-axis direction.

Next, the step S102 drives the three sets of driving mechanisms 71 at a uniform rate to move the lens LE in the upper Z-axis direction by a predetermined amount. The step S103 provides the Lissajou adjustment of the three sets of incremental-type perpendicular-displacement detecting sensors 722, based on the principle described with reference to FIG. 18 while driving the driving mechanisms 71 at the uniform rate. The step S104 returns the lens LE to the lowermost or base position in the Z-axis direction. The step S105 drives the three sets of driving mechanisms 71 at a uniform rate, and moves the lens LE to the upper limit position in the driving range in the upper Z-axis direction. The step S106 scans the reference point of the absolute-type perpendicular-displacement detecting sensor 721 based on the method described with reference to FIG. 19 while executing the step S105. The step S107 defines the reference point of the incremental-type perpendicular-displacement detecting sensor 722.

After the step S107 is executed, the step S108 once returns the lens LE to the basic or the lowermost position. Next, the step S109 moves the lens LE to the design reference position (optical origin) or a position of the origin 0 shown in FIG. 19. The step S110 tilts the lens LE around the X axis and the Y axis by a predetermined amount. The step S111 sequentially provides the Lissajou adjustment of the three incremental-type lateral-displacement detecting sensor 723 together with the step s110.

The step S112 again moves the lens LE to the design reference position (optical origin) or a position of the origin 0 shown in FIG. 19. The step S113 determines the reference point of the incremental-type lateral-displacement detecting sensor 723. This embodiment has no absolute-type lateral-displacement detecting sensor, because a position of the lens frame 74 restricted by the three driving mechanisms 71 cannot be actively controlled in the X-axis and Y-axis directions orthogonal to the Z-axis direction but the lens frame 74 has advantages of high rigidity and position reproducibility in the X-axis and Y-axis directions.

The position reproducibility in the X-axis and Y-axis directions is good in returning the lens LE to the optical origin position based on output signals from the absolute-type perpendicular-displacement detecting sensor 721 and the incremental-type perpendicular-displacement detecting sensor 722. In controlling the lens LE to move to the constant position as the optical origin position, an output value of the incremental-type lateral-displacement detecting sensor 723 is set to the origin. This configuration enables the absolute position in the lateral direction to be precisely determined without an absolute-type lateral-displacement detecting sensor. The sensor initialization routine is thus completed.

The above flow provides the Lissajou adjustments of the incremental-type perpendicular-displacement detecting sensor 722 and the incremental-type lateral-displacement detecting sensor 723, and determines the origin of the lens LE using the absolute-type perpendicular-displacement detecting sensor 721, thereby precisely detecting the translation displacement of the lens LE in the Z-axis direction, and the tilt displacements of the lens LE around the X axis and the Y axis.

The flow shown in FIG. 25 is performed at the assembly completion time of the lens unit 7 and may be properly performed in the final adjustment of the finished semiconductor exposure apparatus 1 shown in FIG. 1 and in the operating time of the exposure apparatus 1 to manufacture semiconductor wafers.

The above first embodiment includes the incremental-type perpendicular-displacement detecting sensor 722 that measures a relative position of the lens LE in the optical-axis C direction of the lens LE, and the absolute-type perpendicular-displacement detecting sensor 721 that measures an absolute position of the sensor 722. Therefore, the first embodiment can measure both the absolute position and the relative position of the lens LE, and provide high positioning precision even at the power resumption.

Since the first embodiment has the incremental-type lateral-displacement detecting sensor 723 that measures the absolute position of the lens LE in the direction orthogonal to the optical-axis C direction, the tilt changing amount of the lens LE can be calculated. The driving mechanisms 71 located at three locations tilt the lens LE, cancelling the alignment error of the reticle image.

First Variation of the Sensor

The above embodiment discusses an absolute-type perpendicular-displacement detecting sensor 721, which is a triangulation sensor as a reference point detecting sensor in a Z-axis direction, and quantitatively detects and outputs a position from a reference point. An alternative embodiment can use, for example, a photoelectric switch type photosensor to determine whether the lens LE as an optical element exists near the reference point.

Figure 26:
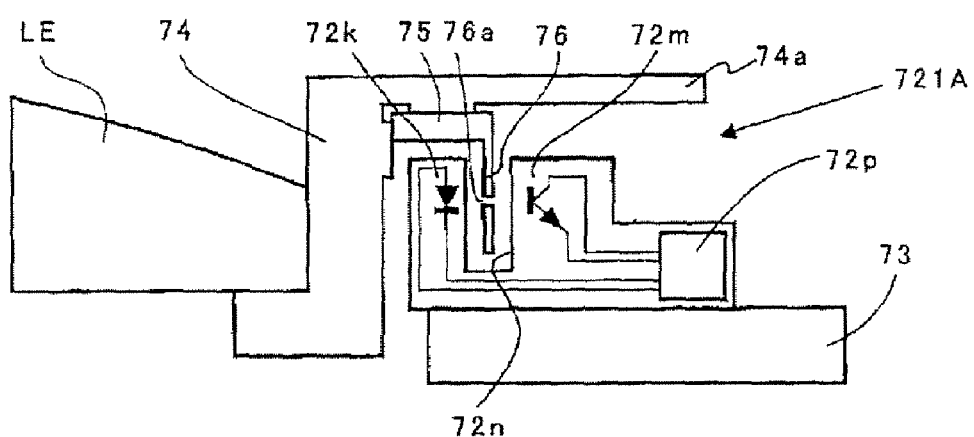
FIG. 26 is an explanatory view showing a sensor used for a lens position detector for an optical element holding unit according to a second embodiment of the present invention.

FIG. 26 illustrates a section near the lens position detector. As illustrated, a perpendicular origin detecting sensor 721A different from an absolute-type perpendicular-displacement detecting sensor 721 of the above embodiment is fixed onto a flat part of the fixture barrel 73. The sensor 721A is a photoelectric switch type photosensor including a light projecting unit 72k as a light emitting diode, and a light receiving unit 72m as a silicon photodiode. The light projecting unit 72k and the light receiving unit 72m are arranged opposite to each other with respect to a detection concave 72n A sensor control circuit 72p is used for driving control and signal processing with the light projecting unit 72k and the light receiving unit 72m.

A target mirror 75 is attached to a flange part 74a of the lens frame 74, and a slit member 76 is attached to the target mirror 75 along the longitudinal direction. The slit member 76 is located between the light projecting unit 72k and the light receiving unit 72m, and used to drive the lens frame 74 as a holding frame and to move the slit member 76 so as to detect a positional change of the lens frame 74. More specifically, it is inserted into a detection concave 72n, and a slit 76a is formed at one location of the insertion part. In the pre-adjustment, a perforation center of the slit 76a accords with an axis that connects a center of the projected luminous flux of the light projecting unit 72k to a center of a light receiving plane of the light receiving unit 72m, when the lens LE is located at the design reference point (optical origin).

Referring now to FIG. 27, a description will be given of reference point scanning and a reference point determination method of the perpendicular origin detecting sensor 721A. In FIGS. 27A to 27D, an abscissa axis denotes a position of the lens LE in the Z-axis direction, and an ordinate axis denotes a sensor output value of the perpendicular origin detecting sensor 721A or incremental-type perpendicular-displacement detecting sensor 722. FIG. 27A shows that the Z-axis direction position (lower limit position) of the lens LE accords with the design reference base position Hbtm1 when the driving mechanism 71 is powered off.

When the voltage is applied to each of the piezoelectric actuators 713 in the three sets of driving mechanisms 71 in this state to drive the lens LE in the Z-axis plus direction, an output value Habs of the perpendicular origin detecting sensor 721A varies like a broken line. The sensor position is pre-adjusted so that when the lens LE reaches a design ideal position as the optical origin or a center of the movable range, a center axis of the detection luminous flux of the sensor 721A accords with the center of the slit 76a and maximizes an output signal of the sensor 721A.

It is thus detectable from the sensor 721A whether the target is located near the reference position or whether the target has passed the reference position, by driving the target in one direction and by measuring the output value of the sensor 721A. However, when the target is distant from the reference position, the sensor 721A cannot acquire information on the target position.

On the other hand, the incremental-type perpendicular-displacement detecting sensor 722 is superior in detection resolution and linearity of the detection output signal, but cannot detect the target's absolute position. The sensor 722 outputs a changing amount after the sensor 722 is powered on, and its output value Hinc varies as shown by a solid line. When an output value Hinc0 of the incremental-type perpendicular-displacement detecting sensor 722 when the lens LE passes the origin is made accorded with an output value Habs0 of the perpendicular origin displacement detecting sensor 721A, a reference point position of the incremental-type perpendicular-displacement detecting sensor 722 is determined. FIG. 27B shows this result. The above action defines the origin of the incremental-type perpendicular-displacement detecting sensor 722 as the reference point Habs0 of the perpendicular origin detecting sensor 721A, enabling the target's absolute position to be substantially detected throughout the movable range.

FIG. 27C shows that a position of the lens LE in the Z-axis direction (or the lower limit position or the base position) shifts by a fine amount from a design value Hbtm1 to Hbtm2 when the driving mechanism 71 is powered off. Conceivably, the lens's base position may shift due to a change of an initial length of the piezoelectric actuator 713 caused by a creep, a change of an initial length of the piezoelectric actuator 713 caused by an exchange, a change of a pilot pressure adjustment amount, etc. When the voltage is applied to piezoelectric actuator 713 at this state to drive the lens LE in the Z-axis plus direction, the output value Habs of the perpendicular origin detecting sensor 721A differs in its output start point from FIG. 27A, but its subsequent output signal traces a broken line shown in FIG. 27A.

On the other hand, the incremental-type perpendicular-displacement detecting sensor 722 outputs a change amount after the power is supplied to the sensor 722. If the base position of the lens LE shifts for the above reasons, the output value Hinc0 indicated by a solid line differs from the output value indicated by a thin line shown in FIG. 27B. However, as described with reference to FIG. 27A, when the output value Hinc0 of the incremental-type perpendicular-displacement detecting sensor 722 when the lens LE passes the origin is calibrated by the output value Habs0 of the perpendicular origin detecting sensor 721A, the reference point position of the sensor 722 is defined. FIG. 27D shows this result, but in the above step, the origin of the incremental-type perpendicular-displacement detecting sensor 722 accords with the case shown in FIG. 27B.

The above adjustment determines a reference point of the incremental-type perpendicular-displacement detecting sensor 722, and enables the sensor 722 to serve as a precise absolute-type perpendicular-displacement detecting sensor.

Second Variation of the Sensor

The above embodiment exemplifies a Michelson type interferometer as the incremental-type displacement detecting sensors 722 and 723, but may use, for example, a linear encoder that measures a moving amount of a diffraction grating by counting the number of interference fringes formed by the diffracted light made from coherent light incident upon a diffraction grating.

Figure 28:
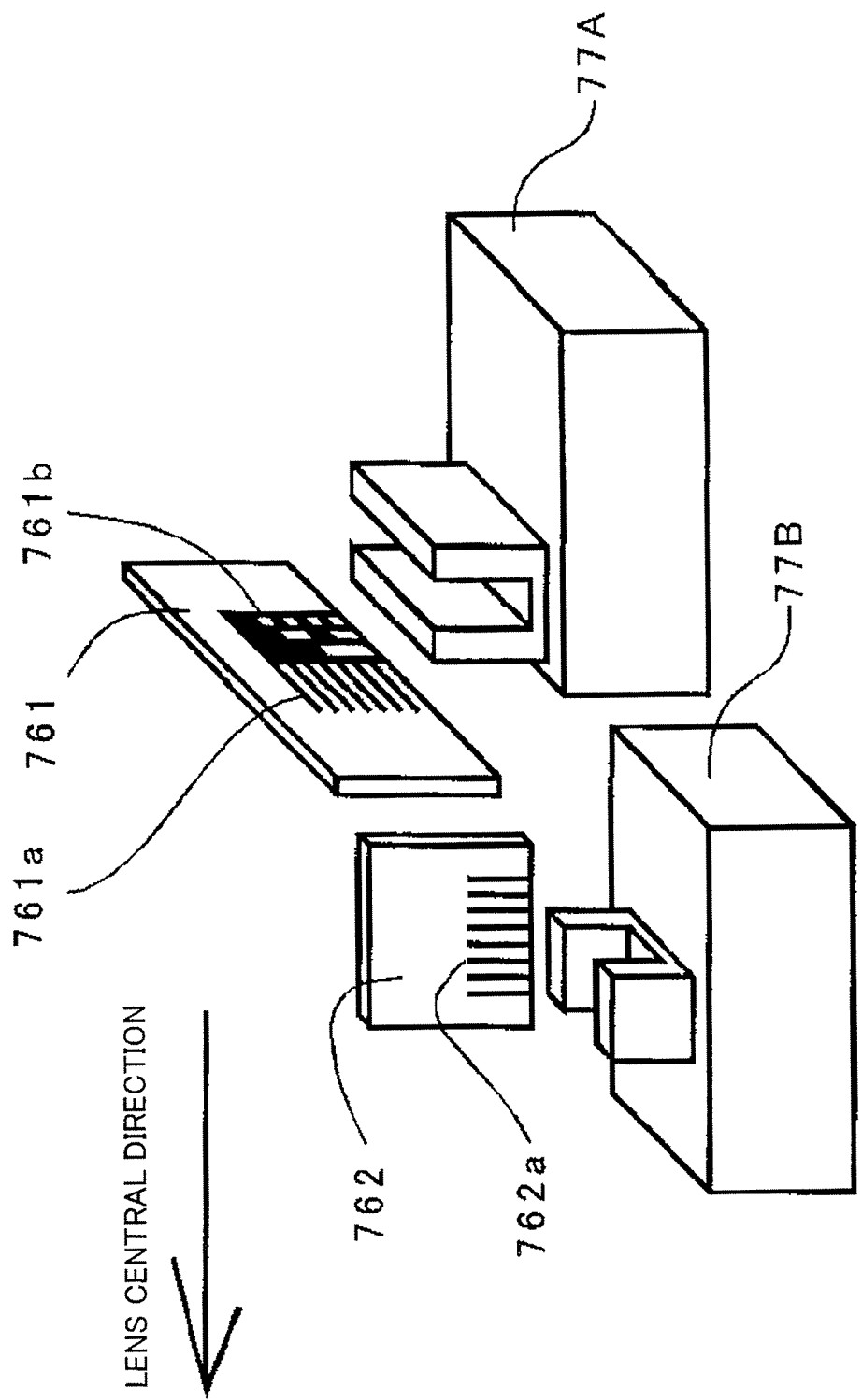
FIG. 28 is an explanatory view of a variation of the incremental-type perpendicular-displacement detecting sensor.

FIG. 28 shows a principal part near a lens position detector. A first target 761 and a second target 762 are fixed onto a bottom surface of the flange part 74a of the lens frame 74 (shown in FIG. 26). The first target 761 is a transparent thin plate having a perpendicular plane of the lens LE in the radial direction, and includes a diffraction grating 761a, and an absolute code track 761b. The diffraction grating 761a is a diffraction grating in which a groove extends in a tangential direction of the outer circumference (lens edge) or in which a concave and a convex are alternately arranged in the lens's optical axis direction. The absolute code track 761b has a code pattern that has plural rows in the tangential direction of the lens's outer circumference. Each row arranges a light shielding part and a transparent part in the optical axis direction according to a predetermined rule.

The second target 762 is a transparent thin plate perpendicular to the first target 761, and has a diffraction grating 762a in which a groove extends in the lens's optical axis direction or in which a concave and a convex are alternatively arranged in the lens's optical axis direction.

The perpendicular-displacement detecting sensor 77A is used to detect the absolute position of the first target 761 in the Z-axis direction. The top of the sensor 77A has a concave, into which the first target 761 is inserted. An encoder disclosed, for example, in JP 9-126723 is used to detect a displacement of the first target 761 in the Z-axis direction. A brief description will now be given of its detection principle.

Part of a laser beam emitted from the sensor is incident upon the diffraction grating 761a, and the transmission diffracted light again enters the sensor 77A. The sensor 77A synthesizes the diffracted beams according to a predetermined method, and creates an interference pattern. As the diffraction grating 761a displaces in the Z-axis direction, a state of the diffracted light varies and the interference pattern moves in the sensor 77A, thus outputting an incremental signal or a periodic signal corresponding to the brightness and darkness of the interference pattern from the photoelectric sensor that measures the interference pattern.

On the other hand, the other part of the laser beam emitted from the sensor 77A is incident upon the absolute code track 761b, and the transmission light returns to the light receiving elements for the absolute code arranged in the sensor 77A. An absolute position of the absolute code track 761b in the Z-axis direction can be detected by processing an output signal of the elements.

A lateral displacement detecting sensor 77B is used to detect a relative moving amount of the second target 762 in the lens's radial direction or a position in the direction crossing the lens's optical axis. The top plane of the lateral displacement detecting sensor 77B has a concave, into which the second target 762 is inserted, so as to detect the relative displacement in the lens's radial direction. The sensor 77B corresponds to the perpendicular displacement detecting sensor 77A but has no absolute displacement detecting function. As the second target 762 moves in the lens's radial direction, an incremental signal or periodic signal corresponding to the moving amount is output.

A period of the incremental signal output from the optical interferometer of the above embodiment depends upon the light source wavelength. A period of the incremental signal output from the linear encoder of the second variation of the sensor depends upon the grating pitch of the diffraction grating. Use of a diffraction grating having a diffraction pitch of a submicron meter would provide a detection resolution similar to the optical interferometer.

Therefore, moving amounts of the first target 761 and the second target 762 can be detected with a resolution of a diffraction pitch order by counting the periodic signal. An electric frequency division of the periodic signal can improve the detection resolution down to the sub-nanometer order. Use of the linear encoder would enlarge the effective area of the diffraction grating, and provide precise position detections over the long stroke, even with an insufficient coherence distance of the encoder's light source.

Second Embodiment

All optical elements in the projection optical system are lenses LE in the first embodiment, whereas the projection optical system of the second embodiment is a catadioptric system that includes first to fourth lens units LE1 to LE4 and first to third mirrors M1 to M3, and a movably supported, driven object is a mirror. In addition, the optical element of the first embodiment has three degrees of freedom of, i.e., a translation in the Z-axis direction, and tilt displacements around the X axis and Y axis, whereas the second embodiment allows only tilting around a predetermined axis.

Figure 29:
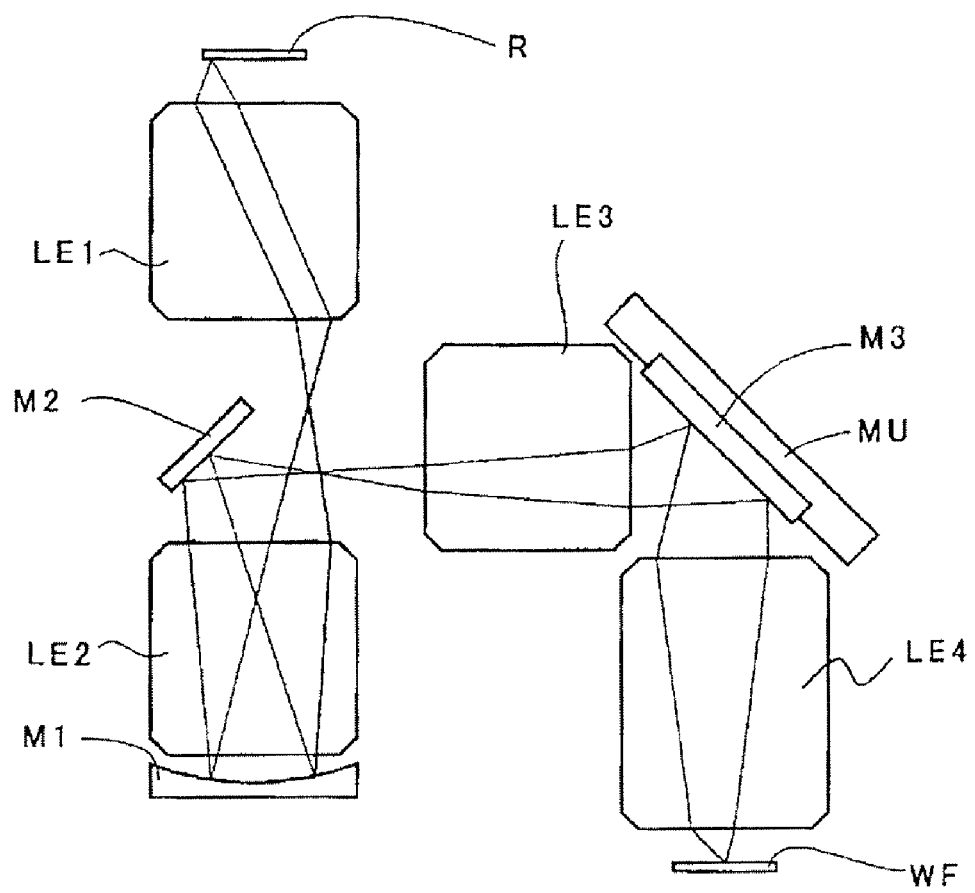
FIG. 29 is an explanatory view showing a projection optical system in an exposure apparatus having an optical element holding unit according to a second embodiment of the present invention.

FIG. 29 shows a projection optical system in the exposure apparatus that includes the optical element holding unit according to a second embodiment of the present invention. The projection optical system includes first to fourth lens units LE1 to LE4, and a mirror unit MU that includes the first mirror M1, and the first to third mirrors M1 to M3. Each of the first to fourth lens units LE1 to LE4 includes plural lenses. Those elements other than the projection optical system are similar to the first embodiment, and thus a description thereof will be omitted.

Figure 30:
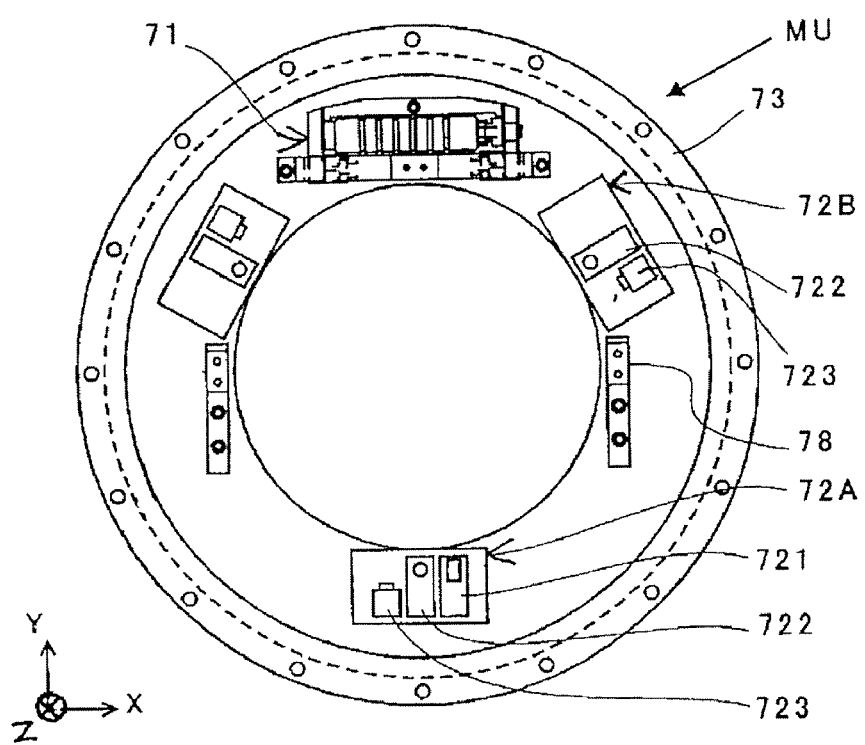
FIG. 30 is an explanatory view showing a detailed structure of the mirror unit shown in FIG. 26.
Figure 31:
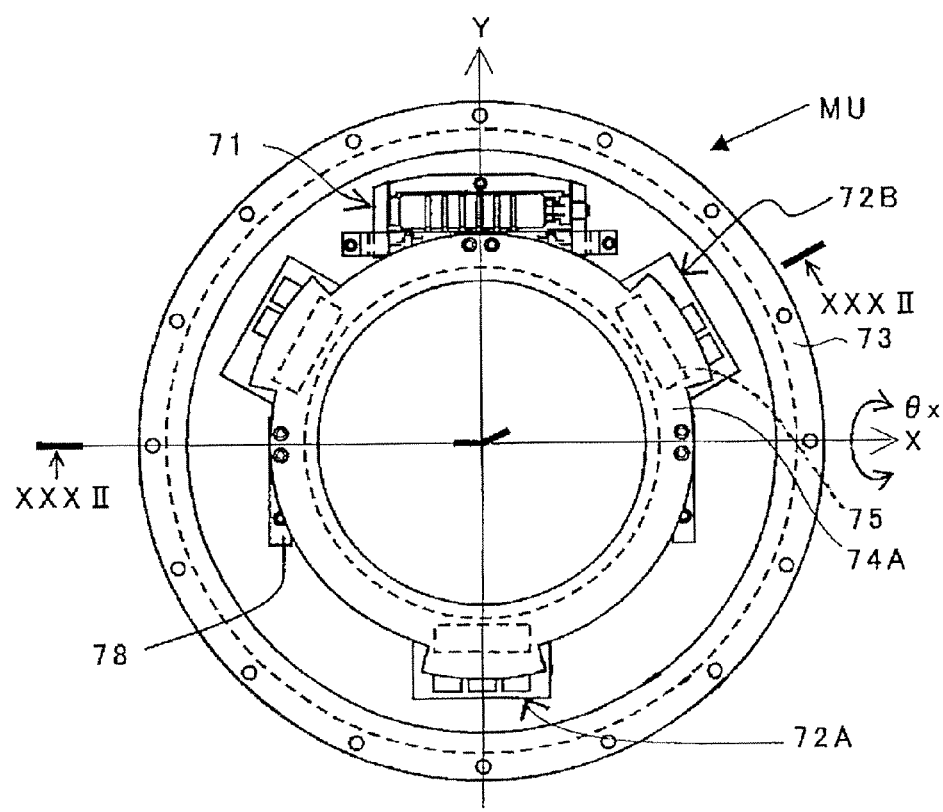
FIG. 31 is an explanatory view showing a structure of the lens unit shown in FIG. 27 to which a lens and a lens frame are attached.
Figure 32:
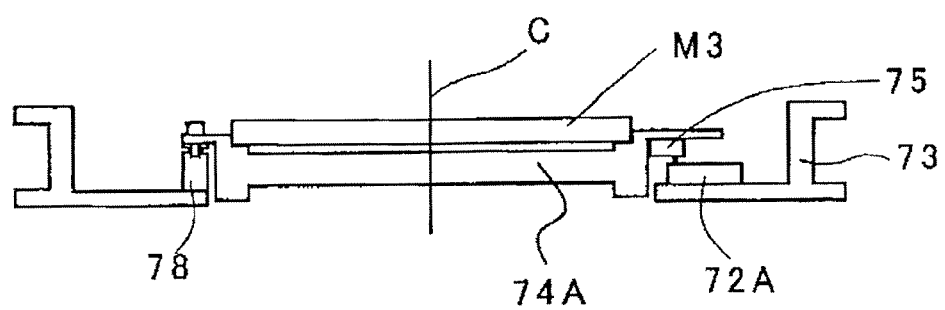
FIG. 32 is a sectional view taken along a line C-C shown in FIG. 28.

FIGS. 30 to 32 show the mirror unit MU used to drive the third mirror M3 in the optical elements in the projection optical system shown in FIG. 29. FIG. 30 is a plane view that removes the third mirror M3 and the mirror frame 74A as a holding frame. FIG. 31 is a plane view that attaches the third mirror M3 and the mirror frame 74A. FIG. 32 shows the section taken along a line XXXIV-XXXIV shown in FIG. 31.

The first embodiment drives and supports the optical element as a driven object through plural sets of driving mechanisms 71, and provides plural degrees of freedom of, i.e., a translation in the Z-axis direction, and tilting around an axis orthogonal to the Z axis. On the other hand, the second embodiment fixes and holds the third mirror M3 as an optical element or the driven object onto the mirror frame 74A, and supports the mirror frame 74A on two pivot members 78.

The pivot members 78 are fixed onto a plane part of the fixture barrel 73 at and oppose to each other with respect to the Y axis, and their uppermost planes and the flange parts 74a of the mirror frame 74A are coupled through screws. A hinge part having a small sectional area is provided at the center part of the pivot member 78, and the elastic deformation of the hinge part allows the uppermost planes to swing at a slight angle. Therefore, the mirror frame 74A fastened to the two pivot members 78 can move only in the θx direction.

One set of driving mechanism 71 is installed at the middle part between the two pivot members 78 or on the Y-axis plus side in FIG. 31. Therefore, when the voltage is applied to the piezoelectric actuator 713 in the driving mechanism 71 and the fastening part with the mirror frame 74 is driven in the Z-axis direction, the mirror frame 74A is tilted in the θx direction.

On the other hand, one mirror-position detector 72A opposes to the driving mechanism 71 with respect to the optical axis C, and two mirror-position detectors 72B each serving as a position measurement supplementing member are spaced by 120° around the optical axis C. Similar to the first embodiment, the former mirror-position detector 72A includes the absolute-type perpendicular-displacement detecting sensor 721, the incremental-type perpendicular-displacement detecting sensor 722, and the incremental-type lateral-displacement detecting sensor 723.

The latter mirror-position detector 72B includes the incremental-type perpendicular-displacement detecting sensor 722 as a first measuring part, and does not include the absolute-type perpendicular-displacement detecting sensor 721 as a second measuring part. The mirror-position detector 72B includes the incremental-type lateral-displacement detecting sensor 723 as a third measuring part.

This is because the mirror frame 74A can be driven only in the ex direction, the degree of freedom is 1, and thus one absolute position detector is enough to cognize the absolute angle from the reference position of the tilt angle. Three incremental-type lateral-displacement detecting sensors 723 are provided as in the first embodiment so as to detect slight displacements in the X-axis and Y-axis directions caused by a slight deformation of the pivot member 78 as the mirror frame 74A tilts, although the third mirror M3 does not have the degree of freedom in the X-axis or Y-axis direction.

The tilt center of the mirror frame 74A, and three incremental-type lateral-displacement detecting sensors 723 are arranged to meet the relationship described with reference to FIGS. 20 to 24. It is noted that the third mirror M3 is allowed to tilt only around the X axis, and prohibited to tilt around the Y axis. Therefore, all incremental-types lateral-displacement detecting sensors 723 should be calibrated through tilting around the X axis.

In the two mirror-position detectors 72B in FIG. 31, a distance between the tilt center and the measuring part of the target mirror 75 in the horizontal direction (Y-axis direction) is half that of the first embodiment. Therefore, an operation similar to that of the first embodiment is available by setting a spacing amount HS in the Z-axis direction between the measuring part of the target mirror 75 and the tilt center twice as large as that of the first embodiment.

Figure 33:
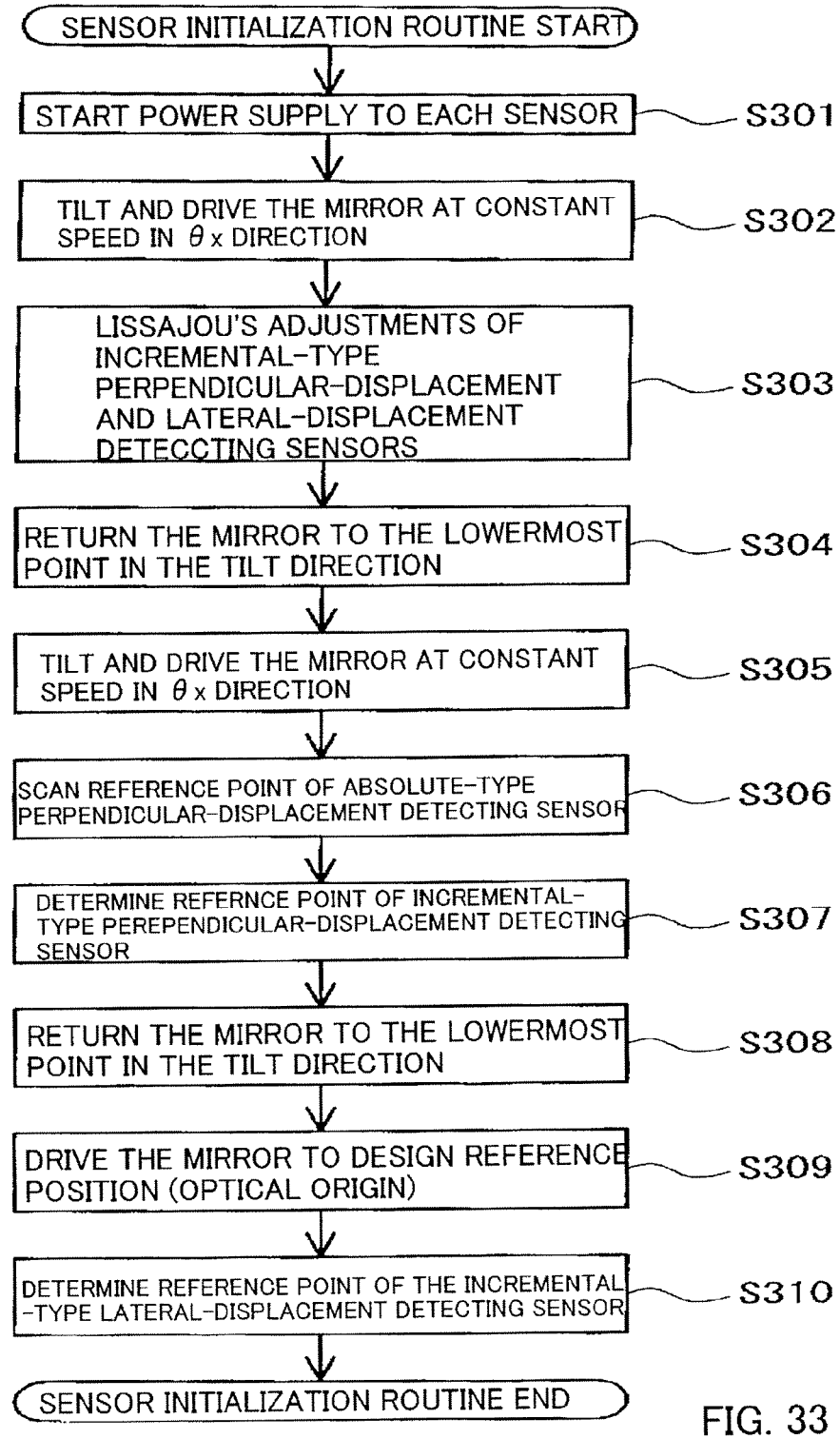
FIG. 33 is a flowchart of a sensor initialization routine for an adjusting step of each sensor according to the second embodiment of the present invention.

FIG. 33 is a flowchart of a sensor initialization routine to execute the adjustment process of each sensor in the second embodiment. Initially, the step S201 starts power supplies to the various sensors in the mirror position detectors 72A and 72B to render a measurable state. Since none of the driving mechanisms 71 are activated in the step S201, the third mirror M3 is located at the base position or one end in the tilting range around the X axis.

The step S202 drives the driving mechanism 71 at a uniform rate to rotate the third mirror M3 around the X axis by a predetermined amount. The step S203 provides the Lissajou adjustment to the three incremental-type perpendicular-displacement detecting sensors 722 and three incremental-type lateral-displacement detecting sensors 723 during the uniform-rate driving step, based on the principle described with reference to FIG. 18. The step S204 returns the third mirror M3 to the lowermost or base position in the tilt direction. The step S205 drives the driving mechanism 71 at a uniform rate, and moves the third mirror M3 at a fixed rate to the upper limit position in the driving range in the upper θx direction.

The step S206 scans the reference point of the absolute-type perpendicular-displacement detecting sensor 721 in the mirror-position detector 72A, based on the method described with reference to FIG. 19, while executing the step S205. Since the third mirror M3 cannot translate in the Z-axis direction in the second embodiment, the lens position in the abscissa axis of FIG. 19 is replaced with the mirror's tilt position in interpretation. Next, the step S207 defines the reference point of the three incremental-type perpendicular-displacement detecting sensors 722.

After the step S207 is executed, the step S208 once returns the third mirror M3 to the base or the lowermost position in the tilting range. Next, the step S209 moves the third mirror M3 to the design reference position (optical origin) or a position of the origin 0 shown in FIG. 19. The step S210 determines the reference points of the three incremental-type lateral-displacement detecting sensors 723. The sensor initialization routine is thus completed after the step S210 is executed.

The above second embodiment includes a mirror-position detector 72B in addition to the mirror-position detector 72A that includes the incremental-type perpendicular-displacement detecting sensor 722 and the absolute-type perpendicular-displacement detecting sensor 721. The mirror-position detector 72B includes the incremental-type perpendicular-displacement detecting sensor 722, and has no absolute-type perpendicular-displacement detecting sensor 721, reducing the installation number of absolute-type perpendicular-displacement detecting sensors 721.

Further, the preferred embodiments of the present invention was made the description of as mentioned above, the present invention is not limited to these preferred embodiments and various variations and modifications may be made without departing from the scope of the present invention.

For example, the second embodiment tilts the optical element around a tilt central axis parallel to the X axis, but may tilt it around a tilt central axis parallel to the Y axis.

In addition, when the driven object is a mirror in the second embodiment, the optical axis does not necessarily accord with a normal that passes the center of the reflected surface. In other words, as apparent from FIG. 29, in each of the first mirror M1, the second mirror M2, and the third mirror M3, the center axis of the incident or exit luminous flux does not accord with the normal that passes the mirror center, and thus the optical axis direction differs according to a definition of the optical axis.

On the other hand, an optimal driving direction necessary for the mirror is one direction selected from among the incident and exit luminous flux directions and the normal direction that passes the reflection surface center according to the design specification of the projection optical system. When the optimal driving direction differs from the normal of the reflection surface center, the driving mechanism 71 may be installed on the fixture barrel 73 so that the output axis direction of the driving mechanism 71 accords with the optimal driving direction, while the driving mechanism 71 is inclined by a predetermined angle.

The incremental-type lateral-displacement detecting sensor 723 in the first and second embodiments has detection sensitivity in the radial direction of the optical element but may have the detection sensitivity in the outer-circumference tangential direction of the optical element.

While the first and second embodiments discuss an illustration that drives the optical element in the optical axis direction, the optical element may be driven in an inclination direction to the optical axis.

This application claims a foreign priority benefit based on Japanese Patent Application Nos. 2006-293429, filed on Oct. 30, 2006, and 2006-291938, filed on Oct. 27, 2006, each of which is hereby incorporated by reference herein in its entirety as if fully set forth herein.

What is claimed is:

1. A holding apparatus for holding an optical element, the apparatus comprising:
    a measuring part configured to measure a coordinate of the optical element; and
    a driving part configured to move the optical element based on the coordinate measured by the measuring part,
    wherein the measuring part includes a first sensor configured to detect a displacement amount of a part of the optical element, and a second sensor configured to detect that a part of the optical element is located at a predetermined position, and
    wherein the measuring part measures a coordinate of the optical element with respect to a translation in a direction of an optical axis of the optical element, and a coordinate of the optical element with respect to a rotation around an axis orthogonal to the optical axis.

2. A holding apparatus according to claim 1, wherein the first sensor is configured to detect the displacement amount in the direction of the optical axis, and the second sensor is configured to detect that a part of the optical element is located at a predetermined position in the direction of the optical axis.

3. A holding apparatus according to claim 1, wherein the measuring part is further configured to measure a coordinate with respect to a translation in a direction of the axis orthogonal to the optical axis.

4. A holding apparatus according to claim 2, wherein each of the first and second sensors is arranged at each of a plurality of parts along a circumference of the optical element.

* * * * *